US012683640B2

(12) United States Patent
Matsumoto et al.

(10) Patent No.: US 12,683,640 B2
(45) Date of Patent: Jul. 14, 2026

(54) RADIO-FREQUENCY MODULE AND COMMUNICATION DEVICE

(71) Applicant: Murata Manufacturing Co., Ltd., Kyoto (JP)

(72) Inventors: Naoya Matsumoto, Kyoto (JP); Takanori Uejima, Kyoto (JP); Yuji Takematsu, Kyoto (JP); Dai Nakagawa, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 446 days.

(21) Appl. No.: 18/066,533

(22) Filed: Dec. 15, 2022

(65) Prior Publication Data

US 2023/0118132 A1 Apr. 20, 2023

Related U.S. Application Data

(63) Continuation of application No. PCT/JP2021/024809, filed on Jun. 30, 2021.

(30) Foreign Application Priority Data

Jul. 15, 2020 (JP) ................................. 2020-121598

(51) Int. Cl.
*H04B 1/38* (2015.01)
*H01Q 1/22* (2006.01)
*H03H 9/64* (2006.01)

(52) U.S. Cl.
CPC ............. *H04B 1/38* (2013.01); *H01Q 1/2283* (2013.01); *H03H 9/64* (2013.01)

(58) Field of Classification Search
CPC .... H01L 23/00; H01Q 1/2283; H03H 9/0542; H03H 9/0552; H03H 9/64; H04B 1/00; H04B 1/38
See application file for complete search history.

(56) References Cited

U.S. PATENT DOCUMENTS

2017/0149288 A1 5/2017 Yanagida et al.
2019/0133106 A1 5/2019 Eom et al.
(Continued)

FOREIGN PATENT DOCUMENTS

CN 102315199 A 1/2012
JP H10-125830 A 5/1998
(Continued)

OTHER PUBLICATIONS

International Preliminary report on Patentability Chapter I for PCT/JP2021/024809 dated Jan. 26, 2023 (Year: 2023).*
(Continued)

*Primary Examiner* — Nader Bolourchi
(74) *Attorney, Agent, or Firm* — McDonald Hopkins LLC

(57) ABSTRACT

A radio-frequency module includes a mount board, an acoustic wave filter, a metal block, a resin layer, and a shield layer. The mount board has a first principal surface and a second principal surface opposite to each other, and has a ground layer. The acoustic wave filter is mounted on the first principal surface of the mount board. The metal block is disposed on the first principal surface of the mount board, and is connected to the ground layer. The resin layer is disposed on the first principal surface of the mount board, and covers the periphery of the acoustic wave filter and the periphery of the metal block. The shield layer covers the principal surface, which is on the opposite side to the mount board side, of the acoustic wave filter, the resin layer, and the metal block. The metal block is in contact with the shield layer.

17 Claims, 13 Drawing Sheets

(56)         References Cited

U.S. PATENT DOCUMENTS

| | | |
|---|---|---|
| 2019/0273312 A1 | 9/2019 | Otsubo |
| 2021/0005579 A1 | 1/2021 | Matsumoto |

FOREIGN PATENT DOCUMENTS

| | | |
|---|---|---|
| JP | 2002-064295 A | 2/2002 |
| JP | 2006-156482 A | 6/2006 |
| JP | 2010-177559 A | 8/2010 |
| JP | 2017-099089 A | 6/2017 |
| JP | 2019-525745 A | 9/2019 |
| WO | 2018/101384 A1 | 6/2018 |
| WO | 2019/181590 A1 | 9/2019 |

OTHER PUBLICATIONS

Japanese patent application publications JP 2006-156482 A to Sony Corp. with English translation (Year: 2006).*
Japanese patent application publications JP H10-125830 A to Hitachi Ltd. with English translation (Year: 1998).*
International Search Report for PCT/JP2021/024809 dated Sep. 7, 2021.

\* cited by examiner

FIG. 3

RADIO-FREQUENCY MODULE AND COMMUNICATION DEVICE

CROSS REFERENCE TO RELATED APPLICATION

This is a continuation of International Application No. PCT/JP2021/024809 filed on Jun. 30, 2021 which claims priority from Japanese Patent Application No. 2020-121598 filed on Jul. 15, 2020. The contents of these applications are incorporated herein by reference in their entireties.

BACKGROUND OF THE DISCLOSURE

Field of the Disclosure

The present disclosure generally relates to a radio-frequency module and a communication device, and more specifically to a radio-frequency module including a mount board, and a communication device including the radio-frequency module.

Description of the Related Art

Patent Document 1 discloses a radio-frequency module including a mount board that has a first principal surface and a second principal surface which are opposite to each other, a transmit filter that is mounted on the first principal surface of the mount board, a resin member that covers the transmit filter, and a shield electrode layer.

In the radio-frequency module disclosed in Patent Document 1, the shield electrode layer is formed so as to cover the top surface and the side surfaces of the resin member.

Patent Document 1: International Publication No. 2019/181590

BRIEF SUMMARY OF THE DISCLOSURE

A radio-frequency module and a communication device including the radio-frequency module may be required to have improved shielding.

A possible benefit of the present disclosure is to provide a radio-frequency module and a communication device which enable improved shielding to be achieved.

A radio-frequency module according to an aspect of the present disclosure includes a mount board, an acoustic wave filter, a metal block, a resin layer, and a shield layer. The mount board has a first principal surface and a second principal surface which are opposite to each other, and has a ground layer. The acoustic wave filter is mounted on the first principal surface of the mount board. The metal block is disposed on the first principal surface of the mount board, and is connected to the ground layer. The resin layer is disposed on the first principal surface of the mount board, and covers the periphery of the acoustic wave filter and the periphery of the metal block. The shield layer covers a principal surface, which is on the opposite side to the mount board side, of the acoustic wave filter, the resin layer, and the metal block. The metal block is in contact with the shield layer.

A radio-frequency module according to an aspect of the present disclosure includes a mount board, an acoustic wave filter, a metal member, a metal block, a resin layer, and a shield layer. The mount board has a first principal surface and a second principal surface which are opposite to each other, and has a ground layer. The acoustic wave filter is mounted on the first principal surface of the mount board.

The metal member is disposed on a principal surface, which is on the opposite side to the mount board side, of the acoustic wave filter. The metal block is disposed on the first principal surface of the mount board, and is connected to the ground layer. The resin layer is disposed on the first principal surface of the mount board, and covers the periphery of the acoustic wave filter, the periphery of the metal member, and the periphery of the metal block. The shield layer covers the resin layer, the metal member, and the metal block. The metal block is in contact with the shield layer.

A communication device according to an aspect of the present disclosure includes the radio-frequency module described above, and a signal processing circuit. The signal processing circuit is connected to the radio-frequency module.

The radio-frequency module and the communication device according to the aspects of the present disclosure enable improved shielding to be achieved.

BRIEF DESCRIPTION OF THE SEVERAL VIEWS OF THE DRAWINGS

FIG. 3 is a diagram illustrating the circuit configuration of a communication device including the radio-frequency module.

DETAILED DESCRIPTION OF THE DISCLOSURE

FIGS. 1, 2, and 4 to 13, which are referred to, for example, in the embodiments below, are schematic diagrams. The ratios in size and thickness of the components in the figures do not always reflect the actual dimensional ratios.

First Embodiment

Figure 1:
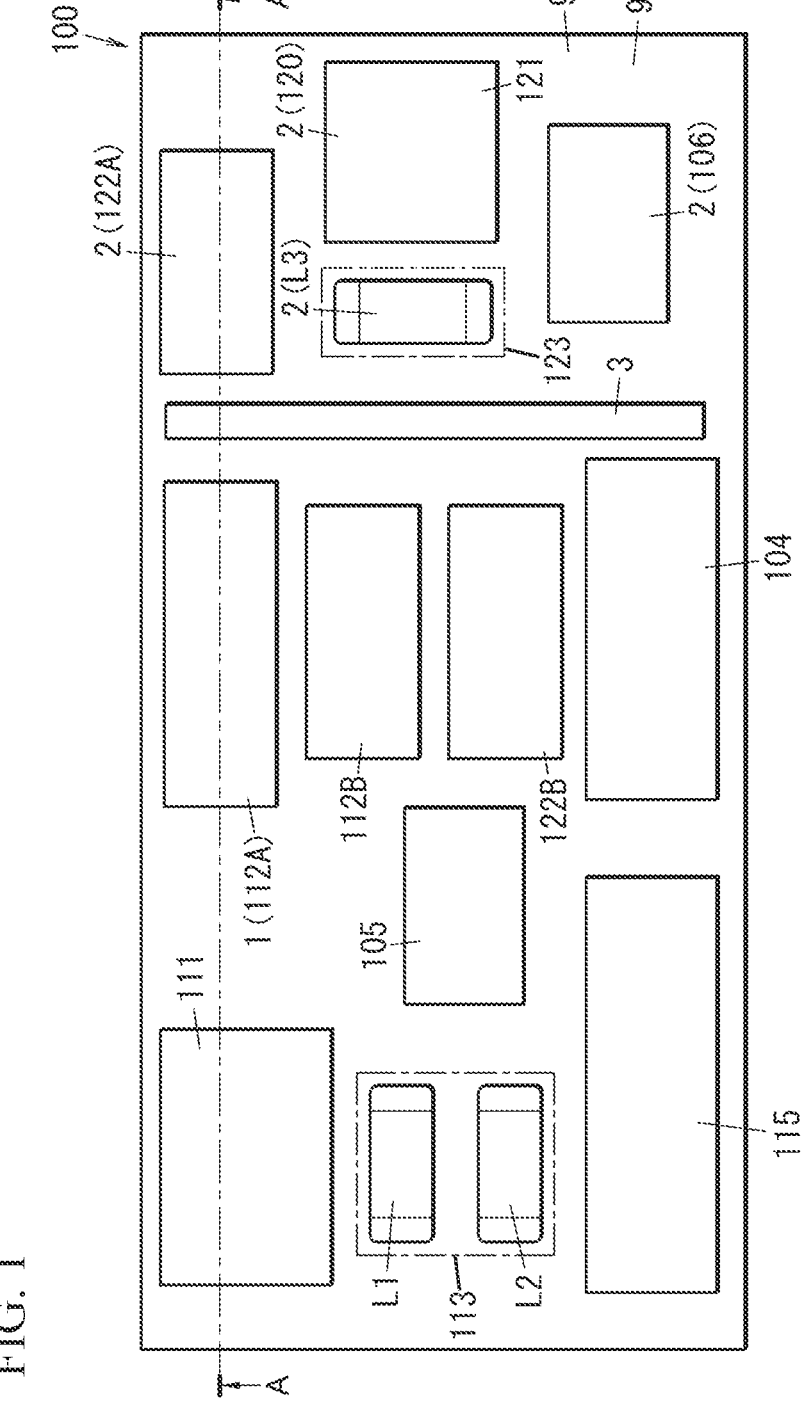
FIG. 1 is a plan view, in which a shield layer and a resin layer are not illustrated, of a radio-frequency module according to a first embodiment.
Figure 2:
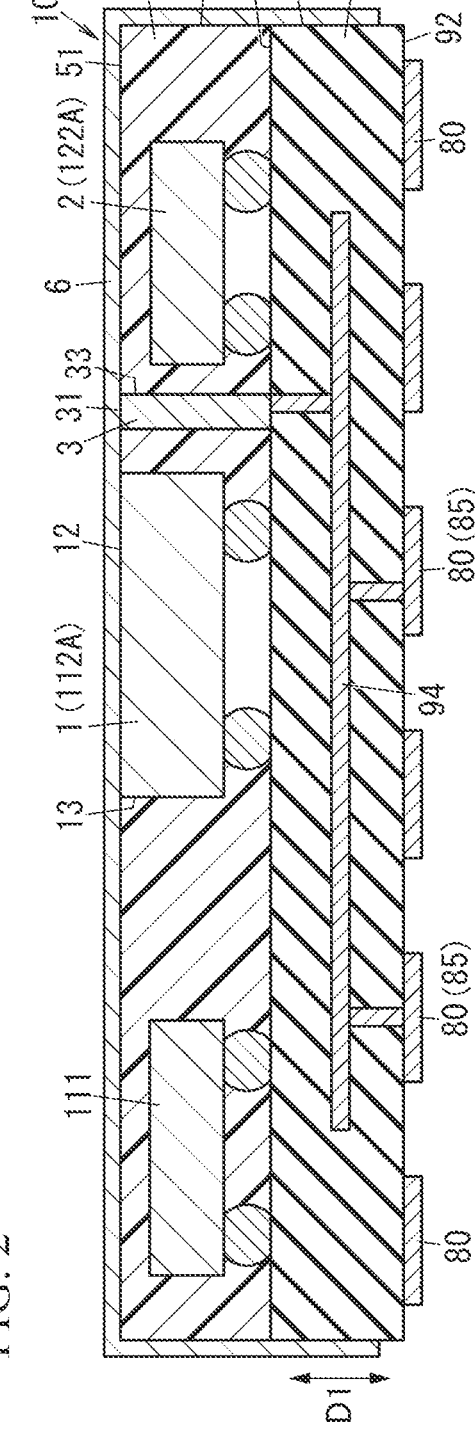
FIG. 2 is a cross-sectional view of the radio-frequency module along line A-A in FIG. 1.

For example, as illustrated in FIGS. 1 and 2, a radio-frequency module 100 according to a first embodiment includes a mount board 9, an acoustic wave filter 1, a metal block 3, a resin layer 5, and a shield layer 6. The mount board 9, which has a first principal surface 91 and a second principal surface 92 which are opposite to each other, includes a ground layer 94. The acoustic wave filter 1 is mounted on the first principal surface 91 of the mount board 9. The metal block 3, which is disposed on the first principal surface 91 of the mount board 9, is connected to the ground layer 94. The resin layer 5, which is disposed on the first principal surface 91 of the mount board 9, covers the periphery 13 of the acoustic wave filter 1 and the periphery 33 of the metal block 3. The shield layer 6 covers a principal surface 12, which is on the opposite side to the mount board 9 side, of the acoustic wave filter 1, the resin layer 5, and the metal block 3.

The radio-frequency module 100 and a communication device 300 according to the first embodiment will be described below more specifically by referring to FIGS. 1 to 3.

Figure 3:
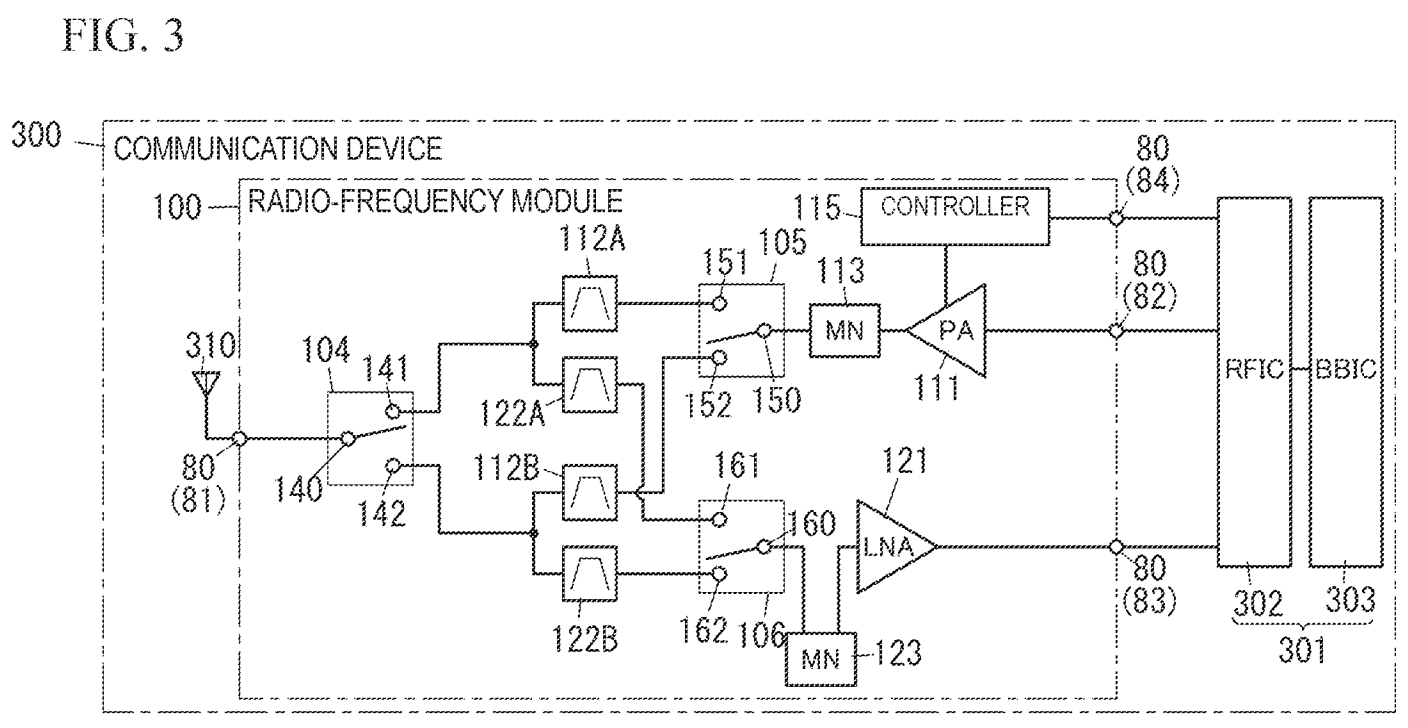

(1) the Radio-Frequency Module and the Communication Device (1.1) the Circuit Configuration of the Radio-Frequency Module and the Communication Device As illustrated in FIG. 3, the radio-frequency module 100 is used, for example, in the communication device 300. The communication device 300 is, for example, a cellular phone (for example, a smartphone). However, the communication device 300 is not limited to this, and may be, for example, a wearable terminal (for example, a smartwatch) or the like. The radio-frequency module 100 is a module which is capable of supporting, for example, a 4G (fourth-generation mobile communication) standard, a 5G (fifth generation mobile communication) standard, or the like. The 4G standard is, for example, the 3GPP (Third Generation Partnership Project) LTE (Long Term Evolution) standard. The 5G standard is, for example, 5G NR (New Radio). For example, the radio-frequency module 100 is a module which is capable of supporting carrier aggregation and dual connectivity.

The radio-frequency module 100 is capable of amplifying, for example, transmit signals (radio-frequency signals), which are received from a signal processing circuit 301, for outputting to an antenna 310. In addition, the radio-frequency module 100 is capable of amplifying receive signals (radio-frequency signals), which are received from the antenna 310, for outputting to the signal processing circuit 301. The signal processing circuit 301 is, not a component of the radio-frequency module 100, a component of the communication device 300 including the radio-frequency module 100. The radio-frequency module 100 is controlled, for example, by the signal processing circuit 301 included in the communication device 300. The communication device 300 includes the radio-frequency module 100 and the signal processing circuit 301. The communication device 300 further includes the antenna 310. The communication device 300 further includes a circuit board on which the radio-frequency module 100 is mounted. The circuit board is, for example, a printed wiring board. The circuit board has a ground electrode to which a ground potential is provided.

The signal processing circuit 301 includes, for example, an RF signal processing circuit 302 and a baseband signal processing circuit 303. The RF signal processing circuit 302, which is, for example, an RFIC (Radio Frequency Integrated Circuit), performs signal processing on radio-frequency signals. For example, the RF signal processing circuit 302 performs signal processing such as upconverting on radio-frequency signals (transmit signals) which are outputted from the baseband signal processing circuit 303, and outputs the radio-frequency signals having been subjected to the signal processing. For example, the RF signal processing circuit 302 performs signal processing such as down-converting on radio-frequency signals (receive signals) which are outputted from the radio-frequency module 100, and outputs the radio-frequency signals, having been subjected to the signal processing, to the baseband signal processing circuit 303. The baseband signal processing circuit 303 is, for example, a BBIC (Baseband Integrated Circuit). The baseband signal processing circuit 303 generates an I-phase signal and a Q-phase signal from a baseband signal. A baseband signal is, for example, an audio signal or an image signal which is inputted from the outside. The baseband signal processing circuit 303 combines the I-phase signal and the Q-phase signal to perform an IQ modulation process, and outputs the transmit signal. At that time, the transmit signal is generated as a modulated signal (IQ signal) obtained by performing amplitude modulation on a carrier signal, having a predetermined frequency, by using a period longer than that of the carrier signal. A receive signal processed by the baseband signal processing circuit 303 is used, for example, as an image signal for image display or as an audio signal for a phone conversation of a user of the communication device 300. The radio-frequency module 100 transmits radio-frequency signals (receive signals, transmit signals) between the antenna 310 and the RF signal processing circuit 302 of the signal processing circuit 301.

The radio-frequency module 100 includes a power amplifier 111 and a low-noise amplifier 121. The radio-frequency module 100 also includes multiple (for example, two) transmit filters 112A and 112B and multiple (for example, two) receive filters 122A and 122B. The radio-frequency module 100 also includes an output matching circuit 113 and an input matching circuit 123. The radio-frequency module 100 also includes a first switch 104, a second switch 105, and a third switch 106. The radio-frequency module 100 further includes a controller 115. In the radio-frequency module 100, the transmit filters 112A and 112B correspond one-to-one to the receive filters 122A and 122B. The transmit filter 112A, having a smaller frequency difference between the passbands of the transmit filter 112A and the corresponding receive filter 122A than that between the passbands of the transmit filter 112B and the corresponding receive filter 122B, forms the acoustic wave filter 1 (see FIGS. 1 and 2).

The radio-frequency module 100 also includes multiple external connection terminals 80. The external connection terminals 80 include an antenna terminal 81, a signal input terminal 82, a signal output terminal 83, a control terminal 84, and multiple ground terminals 85 (see FIG. 2). The ground terminals 85 are terminals which are electrically connected to the ground electrode of the circuit board included in the communication device 300 and to which the ground potential is provided.

The power amplifier 111 has an input terminal and an output terminal. The power amplifier 111 amplifies transmit signals in a first frequency band, which are received at the input terminal, for outputting from the output terminal. The first frequency band includes, for example, a first communication band and a second communication band. The first communication band, which corresponds to transmit signals passing through the transmit filter 112A, is, for example, Band22 of the 3GPP LTE standard. The second communication band, which corresponds to transmit signals passing through the transmit filter 112B, is, for example, Band11 of the 3GPP LTE standard. The power amplifier 111 is connected, at the input terminal, to the signal input terminal 82. The power amplifier 111 is connected, at the input terminal, to the signal processing circuit 301 through the signal input terminal 82. The signal input terminal 82 is a terminal for inputting, to the radio-frequency module 100, radio-frequency signals (transmit signals) from an external circuit (for example, the signal processing circuit 301). The power amplifier 111 is connected, at the output terminal, to a common terminal 150 of the second switch 105 through the output matching circuit 113.

The low-noise amplifier 121 has an input terminal and an output terminal. The low-noise amplifier 121 amplifies receive signals in a second frequency band, which are received at the input terminal, for outputting from the output terminal. For example, the second frequency band, which is the same as the first frequency band, has the first communication band and the second communication band. The low-noise amplifier 121 is connected, at the input terminal, to a common terminal 160 of the third switch 106 through the input matching circuit 123. The low-noise amplifier 121 is connected, at the output terminal, to the signal output terminal 83. The low-noise amplifier 121 is connected, at the output terminal, for example, to the signal processing circuit 301 through the signal output terminal 83. The signal output terminal 83 is a terminal for outputting, to an external circuit (for example, the signal processing circuit 301), radio-frequency signals (receive signals) from the low-noise amplifier 121.

The transmit filter 112A is a filter, for example, whose passband matches the transmit band of the first communication band. The transmit filter 112B is a filter, for example, whose passband matches the transmit band of the second communication band. The receive filter 122A is a filter, for example, whose passband matches the receive band of the first communication band. The receive filter 122B is a filter, for example, whose passband matches the receive band of the second communication band.

The first switch 104 has a common terminal 140 and multiple (for example, two) selection terminals 141 and 142. The common terminal 140 is connected to the antenna terminal 81. The antenna terminal 81 is connected to the antenna 310. The selection terminal 141 is connected to the connection point between the output terminal of the transmit filter 112A and the input terminal of the receive filter 122A. The selection terminal 142 is connected to the connection point between the output terminal of the transmit filter 112B and the input terminal of the receive filter 122B. The first switch 104 is, for example, a switch which is capable of connecting at least one or more of the selection terminals 141 and 142 to the common terminal 140. The first switch 104 is, for example, a switch which enables one-to-one connection and one-to-many connection.

The first switch 104 is controlled, for example, by the signal processing circuit 301. The first switch 104 switches the connection state between the common terminal 140 and the selection terminals 141 and 142 in accordance with a control signal from the RF signal processing circuit 302 of the signal processing circuit 301. The first switch 104 is, for example, a switch IC (Integrated Circuit).

The second switch 105 has the common terminal 150 and multiple (for example, two) selection terminals 151 and 152. The common terminal 150 is connected to the output terminal of the power amplifier 111 through the output matching circuit 113. The selection terminal 151 is connected to the input terminal of the transmit filter 112A. The selection terminal 152 is connected to the input terminal of the transmit filter 112B. The second switch 105 is, for example, a switch which is capable of connecting at least one or more of the selection terminals 151 and 152 to the common terminal 150. The second switch 105 is, for example, a switch which enables one-to-one connection and one-to-many connection.

The second switch 105 is controlled, for example, by the signal processing circuit 301. The second switch 105 switches the connection state between the common terminal 150 and the selection terminals 151 and 152 in accordance with a control signal from the RF signal processing circuit 302 of the signal processing circuit 301. The second switch 105 is, for example, a switch IC.

The third switch 106 has the common terminal 160 and multiple (for example, two) selection terminals 161 and 162. The common terminal 160 is connected to the input terminal of the low-noise amplifier 121 through the input matching circuit 123. The selection terminal 161 is connected to the output terminal of the receive filter 122A. The selection terminal 162 is connected to the output terminal of the receive filter 122B. The third switch 106 is, for example, a switch which is capable of connecting at least one or more of the selection terminals 161 and 162 to the common terminal 160. The third switch 106 is, for example, a switch which enables one-to-one connection or one-to-many connection.

The third switch 106 is controlled, for example, by the signal processing circuit 301. The third switch 106 switches the connection state between the common terminal 160 and the selection terminals 161 and 162 in accordance with a control signal from the RF signal processing circuit 302 of the signal processing circuit 301. The third switch 106 is, for example, a switch IC.

The output matching circuit 113 is disposed on the signal path between the output terminal of the power amplifier 111 and the common terminal 150 of the second switch 105. The output matching circuit 113 is a circuit for matching the impedance between the power amplifier 111 and the transmit filters 112A and 112B. The output matching circuit 113 includes, for example, two inductors L1 and L2 (see FIG. 1). However, the configuration is not limited to this. For example, the output matching circuit 113 may be formed of a single inductor, or may include multiple inductors and multiple capacitors.

The input matching circuit 123 is disposed on the signal path between the input terminal of the low-noise amplifier 121 and the common terminal 160 of the third switch 106. The input matching circuit 123 is a circuit for matching the impedance between the low-noise amplifier 121 and the receive filters 122A and 122B. The input matching circuit 123 is formed, for example, of a single inductor L3 (see FIG. 1). However, the configuration is not limited to this. For example, the input matching circuit 123 may include multiple inductors and multiple capacitors.

The controller 115 is connected to the control terminal 84. The controller 115 is connected, for example, to the signal processing circuit 301 through the control terminal 84. The control terminal 84 is a terminal for inputting, to the radio-frequency module 100, a control signal from an external circuit (for example, the signal processing circuit 301).

The controller 115 controls the power amplifier 111 on the basis of a control signal from the signal processing circuit 301.

(1.2) The Structure of the Radio-Frequency Module

As illustrated in FIGS. 1 and 2, the radio-frequency module 100 includes the mount board 9 and multiple circuit components. The circuit components include the power amplifier 111, an IC chip 120 including the low-noise amplifier 121, the two transmit filters 112A and 112B, the two receive filters 122A and 122B, the circuit components (the two inductors L1 and L2) of the output matching circuit 113, and the circuit component (the inductor L3) of the input matching circuit 123. The circuit components further include the first switch 104, the second switch 105, the third switch 106, and the controller 115. The radio-frequency module 100 further includes the external connection terminals 80. The external connection terminals 80 include the antenna terminal 81, the signal input terminal 82, the signal output terminal 83, the control terminal 84, and the ground terminals 85.

The mount board 9 has the first principal surface 91 and the second principal surface 92 which are opposite to each other in the thickness direction D1 of the mount board 9. The mount board 9 is, for example, a multilayer substrate including multiple dielectric layers and multiple conductive layers. The dielectric layers and the conductive layers are laminated in the thickness direction D1 of the mount board 9. The conductive layers are formed in the predetermined patterns defined for the respective layers. Each of the conductive layers includes one or more conductive portions in a plane orthogonal to the thickness direction D1 of the mount board 9. The material of the conductive layers is, for example, copper. The conductive layers include a ground layer 94 (see FIG. 2). In the radio-frequency module 100, the ground terminals 85 are electrically connected to the ground layer 94 through via conductors or the like included in the mount board 9. The mount board 9 is, for example, an LTCC (Low Temperature Co-fired Ceramics) substrate. The mount board 9 is not limited to an LTCC substrate, and, for example, may be a printed wiring board, an HTCC (High Temperature Co-fired Ceramics) substrate, or a multilayer resin substrate.

The mount board 9 is not limited to an LTCC substrate, and, for example, may be a wiring structure. The wiring structure is, for example, a multilayer structure. The multilayer structure includes at least one insulating layer and at least one conductive layer. The insulating layer is formed in a predetermined pattern. In the case of multiple insulating layers, the insulating layers are formed in predetermined patterns defined for the respective layers. The conductive layer is formed in a predetermined pattern different from the predetermined pattern of the insulating layer. In the case of multiple conductive layers, the conductive layers are formed in predetermined patterns defined for the respective layers. The conductive layer may include one or more redistribution portions. In the wiring structure, among two surfaces opposite to each other in the thickness direction of the multilayer structure, a first surface is the first principal surface 91 of the mount board 9; a second surface is the second principal surface 92 of the mount board 9. The wiring structure may be, for example, an interposer. The interposer may be an interposer formed by using a silicon substrate, or may be a substrate including multiple layers.

The first principal surface 91 and the second principal surface 92 of the mount board 9 are spaced apart from each other in the thickness direction D1 of the mount board 9, and cross the thickness direction D1 of the mount board 9. The first principal surface 91 of the mount board 9 is, for example, orthogonal to the thickness direction D1 of the mount board 9. Alternatively, for example, the first principal surface 91 may include side surfaces or the like of the conductive portions as surfaces which are not orthogonal to the thickness direction D1. The second principal surface 92 of the mount board 9 is, for example, orthogonal to the thickness direction D1 of the mount board 9. Alternatively, for example, the second principal surface 92 may include side surfaces or the like of the conductive portions as surfaces which are not orthogonal to the thickness direction D1. The first principal surface 91 and the second principal surface 92 of the mount board 9 may have minute unevenness, a recess portion, or a protrusion portion formed thereon. For example, when a recess portion is formed on the first principal surface 91 of the mount board 9, the inner surfaces of the recess portion are included in the first principal surface 91.

In the radio-frequency module 100 according to the first embodiment, the circuit components are mounted on the first principal surface 91 of the mount board 9. The expression, "A circuit component is mounted on the first principal surface 91 of the mount board 9." encompasses the state in which the circuit component is disposed on (is mechanically connected to) the first principal surface 91 of the mount board 9, and the state in which the circuit component is electrically connected to (an appropriate conductive portion of) the mount board 9. Therefore, in the radio-frequency module 100, the circuit components are disposed on the first principal surface 91 of the mount board 9. The radio-frequency module 100 may include, not only the circuit components mounted on the mount board 9, but also circuit elements disposed in the mount board 9.

The power amplifier 111 is an IC chip including a circuit unit having a transistor for the amplification of radio-frequency signals (transmit signals). The power amplifier 111 is flip-chip packaged on the first principal surface 91 of the mount board 9. In plan view in the thickness direction D1 of the mount board 9, the outer shape of the power amplifier 111 is quadrate. The transistor for amplification is, for example, an HBT (Heterojunction Bipolar Transistor). In this case, the IC chip forming the power amplifier 111 is, for example, a GaAs-based IC chip. The transistor for amplification is not limited to a bipolar transistor such as an HBT, and may be, for example, a FET (Field Effect Transistor). The FET is, for example, a MOSFET (Metal-Oxide-Semiconductor Field Effect Transistor). The IC chip forming the power amplifier 111 is not limited to a GaAs-based IC chip, and may be, for example, an Si-based IC chip, an SiGe-based IC chip, or a GaN-based IC chip.

The IC chip 120 including the low-noise amplifier 121 is an IC chip including a circuit unit having a transistor for the amplification of radio-frequency signals (receive signals). The IC chip 120 is flip-chip packaged on the first principal surface 91 of the mount board 9. In plan view in the thickness direction D1 of the mount board 9, the outer shape of the IC chip 120 is quadrate. The transistor for amplification is a field-effect transistor. However, the configuration is not limited to this. The transistor for amplification may be, for example, a bipolar transistor. The IC chip 120 is an Si-based IC chip. However, the configuration is not limited to this.

Each of the two transmit filters 112A and 112B and the two receive filters 122A and 122B, which is, for example, a ladder filter, has multiple (for example, four) serial arm resonators and multiple (for example, three) parallel arm resonators. Each of the two transmit filters 112A and 112B and the two receive filters 122A and 122B is, for example, an acoustic wave filter. The acoustic wave filter is formed of multiple serial arm resonators and multiple parallel arm resonators, each of which is an acoustic wave resonator. The acoustic wave filter is, for example, a surface acoustic wave filter using surface acoustic waves.

In the surface acoustic wave filter, each of the serial arm resonators and the parallel arm resonators is, for example, a SAW (Surface Acoustic Wave) resonator.

The surface acoustic wave filter includes, for example, a substrate having piezoelectricity, multiple IDT (Interdigital Transducer) electrodes which are formed on the substrate having piezoelectricity and which correspond one-to-one to multiple serial arm resonator, and multiple IDT electrodes which are formed on the substrate having piezoelectricity and which correspond one-to-one to multiple parallel arm resonators. The substrate having piezoelectricity is, for example, a piezoelectric substrate. The piezoelectric substrate is, for example, a lithium niobate substrate, a lithium tantalate substrate, or a quartz substrate. The substrate having piezoelectricity is not limited to a piezoelectric substrate, and for example, may be a laminated substrate including a silicon substrate, a high acoustic velocity film on the silicon substrate, a low acoustic velocity film on the high acoustic velocity film, and a piezoelectric layer on the low acoustic velocity film. In the laminated substrate, the material of the piezoelectric layer is, for example, lithium niobate or lithium tantalate. The low acoustic velocity film is a film in which the acoustic velocity of bulk waves propagating through the low acoustic velocity film is lower than that of bulk waves propagating through the piezoelectric layer. The material of the low acoustic velocity film is, for example, silicon oxide. The high acoustic velocity film is a film in which the acoustic velocity of bulk waves propagating through the high acoustic velocity film is higher than that of acoustic waves propagating through the piezoelectric layer. The material of the high acoustic velocity film is, for example, silicon nitride.

Each of the two transmit filters 112A and 112B is, for example, a bare-chip (also called bare-die) acoustic wave filter. In plan view in the thickness direction D1 of the mount board 9, the outer shape of each of the two transmit filters 112A and 112B is quadrate. Each of the two transmit filters 112A and 112B is flip-chip packaged on the first principal surface 91 of the mount board 9.

Each of the two receive filters 122A and 122B is, for example, a bare-chip (also called bare-die) acoustic wave filter. In plan view in the thickness direction D1 of the mount board 9, the outer shape of each of the two receive filters 122A and 122B is quadrate. Each of the two receive filters 122A and 122B is flip-chip packaged on the first principal surface 91 of the mount board 9.

Each of the first switch 104, the second switch 105, and the third switch 106 is an IC chip including a circuit unit having multiple FETs (Field Effect Transistors). The circuit unit is a functional unit having a function of switching the connection state between a common terminal and multiple selection terminals. Each of the first switch 104, the second switch 105, and the third switch 106 is flip-chip packaged on the first principal surface 91 of the mount board 9. In plan view in the thickness direction D1 of the mount board 9, the outer shape of each of the first switch 104, the second switch 105, and the third switch 106 is quadrate.

Each of the two inductors L1 and L2 in the output matching circuit 113 is, for example, a chip inductor. For example, the two inductors L1 and L2 in the output matching circuit 113 are mounted on the first principal surface 91 of the mount board 9. In plan view in the thickness direction D1 of the mount board 9, the outer shape of each of the two inductors L1 and L2 is quadrate. The output matching circuit 113 may include an inner-layer inductor disposed in the mount board 9. In addition, the configuration of the output matching circuit 113 is not limited to the configuration having the two inductors L1 and L2. The output matching circuit 113 may be a transformer.

The inductor L3 included in the input matching circuit 123 is, for example, a chip inductor. In plan view in the thickness direction D1 of the mount board 9, the outer shape of the inductor L3 is quadrate. The input matching circuit 123 may include an inner-layer inductor disposed in the mount board 9.

The external connection terminals 80 are disposed on the second principal surface 92 of the mount board 9. The expression, "An external connection terminal 80 is disposed on the second principal surface 92 of the mount board 9." encompasses the state in which the external connection terminal 80 is mechanically connected to the second principal surface 92 of the mount board 9, and the state in which the external connection terminal 80 is electrically connected to (an appropriate conductive portion of) the mount board 9. The material of the external connection terminals 80 is, for example, a metal (for example, copper, or a copper alloy).

The external connection terminals 80 include the ground terminals 85 in addition to the antenna terminal 81, the signal input terminal 82, the signal output terminal 83, and the control terminal 84. As described above, the ground terminals 85 are electrically connected to the ground layer 94 of the mount board 9. The ground layer 94 is a circuit ground of the radio-frequency module 100, and the circuit components of the radio-frequency module 100 include circuit components which are electrically connected to the ground layer 94.

The metal block 3 is disposed on the first principal surface 91 of the mount board 9. The expression, "The metal block 3 is disposed on the first principal surface 91 of the mount board 9." encompasses the state in which the metal block 3 is mechanically connected to the first principal surface 91 of the mount board 9, and the state in which the metal block 3 is electrically connected to (an appropriate conductive portion of) the mount board 9. The conductive portion which is electrically connected to the metal block 3 is a conductive portion connected to the ground layer 94.

The material of the metal block 3 is, for example, copper or a copper alloy. The metal block 3 is joined to the conductive portion of the mount board 9, for example, by using solder. However, the configuration is not limited to this. For example, the metal block 3 may be joined by using a conductive adhesive (for example, a conductive paste), or may be joined directly.

In plan view in the thickness direction D1 of the mount board 9, the metal block 3 is spaced apart from any of the circuit components. In plan view in the thickness direction D1 of the mount board 9, the metal block 3 is spaced apart from the edge of the mount board 9. In plan view in the thickness direction D1 of the mount board 9, the metal block 3 has a linear shape. The thickness of the metal block 3 in the thickness direction D1 of the mount board 9 is larger than that of the acoustic wave filter 1. The thickness of the metal block 3 is substantially the same as the distance between the mount board 9 and the shield layer 6 in the thickness direction D1 of the mount board 9. In plan view in the thickness direction D1 of the mount board 9, the length, in the longitudinal direction, of the metal block 3 is longer than that of each of the four sides of the acoustic wave filter 1. In plan view in the thickness direction D1 of the mount board 9, the length, in the short-side direction, of the metal block 3 is shorter than that of each of the four sides of the acoustic wave filter 1. In plan view in the thickness direction D1 of the mount board 9, the metal block 3 is disposed so that the two long sides are substantially parallel to two of the four sides of the mount board 9. The shape of the metal block 3 in plan view in the thickness direction D1 of the mount board 9 is not limited to a linear shape, and may be any shape, such as a curved shape, a polygonal-line shape, a shape of combination of straight lines and curves, a comb shape, or a frame shape.

The resin layer 5 covers, on the first principal surface 91 side of the mount board 9, at least a portion of each of the circuit components mounted on the first principal surface 91 of the mount board 9. The resin layer 5 contains a resin (for example, an epoxy resin). The resin layer 5 may contain a filler in addition to a resin. The resin layer 5 covers the periphery of each of the circuit components, and also covers the principal surfaces, which are on the opposite side to the mount board 9 side, of some of the circuit components. The periphery 13 of the acoustic wave filter 1 is covered by the resin layer 5. The principal surface 12, which is on the opposite side to the mount board 9 side, of the acoustic wave filter 1 is not covered by the resin layer 5.

The shield layer 6 is conductive. The shield layer 6 has a multilayer structure having laminated metal layers. However, the configuration is not limited to this. The shield layer 6 may be formed of a single metal layer. The metal layer contains one or more types of metal. The shield layer 6 covers a principal surface 51, which is on the opposite side to the mount board 9 side, of the resin layer 5, the periphery 53 of the resin layer 5, and the periphery 93 of the mount board 9. The shield layer 6 is in contact with at least a portion of the periphery of the ground layer 94 included in the mount board 9. The shield layer 6 covers the metal block 3. Thus, the shield layer 6 is in contact with the metal block 3. More specifically, the shield layer 6 is in contact with a surface 31, which is on the opposite side to the mount board 9 side, of the metal block 3. The shield layer 6 is in direct contact with substantially the entire area of the surface 31, which is on the opposite side to the mount board 9 side, of the metal block 3. The shield layer 6 covers the principal surface 12, which is on the opposite side to the mount board 9 side, of the acoustic wave filter 1. Thus, the shield layer 6 is in contact with the principal surface 12, which is on the opposite side to the mount board 9 side, of the acoustic wave filter 1. The shield layer 6 is in direct contact with substantially the entire area of the principal surface 12, which is on the opposite side to the mount board 9 side, of the acoustic wave filter 1.

When the shield layer 6 has a multilayer structure, the lowest metal layer of the metal layers may be used as a close-contact layer for the metal block 3, the acoustic wave filter 1, and the resin layer 5. The other metal layers may be formed of metal layers each having a conductivity higher than that of the close-contact layer.

In the radio-frequency module 100 according to the first embodiment, the principal surface 12, which is on the opposite side to the mount board 9 side, of the acoustic wave filter 1, the principal surface 51 of the resin layer 5, and the surface 31 of the metal block 3 are substantially flush with each other. However, the configuration is not limited to this.

(1.3) The Layout of the Circuit Components in the Radio-Frequency Module

In the radio-frequency module 100, the acoustic wave filter 1 is the transmit filter 112A. In the radio-frequency module 100, the acoustic wave filter 1 is adjacent to the metal block 3 in plan view in the thickness direction D1 of the mount board 9. The expression, "The acoustic wave filter 1 is adjacent to the metal block 3." means that, in plan view in the thickness direction D1 of the mount board 9, no other circuit components are present between the acoustic wave filter 1 and the metal block 3, and that the acoustic wave filter 1 is next to the metal block 3.

In addition, in the radio-frequency module 100, among the circuit components, each of the receive filter 122A, the IC chip 120 including the low-noise amplifier 121, the inductor L3 of the input matching circuit 123, and the third switch 106 forms an electronic component 2 which is positioned on the opposite side to the acoustic wave filter 1 when viewed from the metal block 3.

In plan view in the thickness direction D1 of the mount board 9, the power amplifier 111 is disposed close to one of the four corners of the first principal surface 91, which is quadrate, of the mount board 9. The power amplifier 111 is positioned on the opposite side to the electronic components 2 when viewed from the metal block 3. The power amplifier 111 is positioned on the opposite side to the metal block 3 when viewed from the acoustic wave filter 1. In the radio-frequency module 100, in the direction in which the power amplifier 111 and the acoustic wave filter 1 are lined up, no other circuit components are present on the opposite side to the acoustic wave filter 1 when viewed from the power amplifier 111, and the power amplifier 111 is adjacent to the shield layer 6.

(2) The Manufacture Method of the Radio-Frequency Module

As the manufacture method of the radio-frequency module 100, for example, a manufacture method including the first process, the second process, the third process, and the fourth process may be employed. The first process is a process in which the circuit components are mounted on the first principal surface 91 of the mount board 9 and in which the metal block 3 is disposed. The second process is a process in which a resin material layer, which covers the circuit components and the metal block 3 and which will be the resin layer 5, is formed on the first principal surface 91 side of the mount board 9. The third process is a process in which, after the resin material layer is ground from the principal surface, which is on the opposite side to the mount board 9 side, of the resin material layer to expose the acoustic wave filter 1 and the metal block 3, the resin material layer, the substrate, having piezoelectricity, of the acoustic wave filter 1, and the metal block 3 are ground to form the resin layer 5 and make the substrate, having piezoelectricity, of the acoustic wave filter 1 and the metal block 3 thin. The fourth process is a process in which the shield layer 6, which covers the principal surface 51 of the resin layer 5, the principal surface 12 of the acoustic wave filter 1, and the metal block 3, is formed, for example, by using the evaporation method, the sputtering method, or the print method.

(3) Effects (3.1) the Radio-Frequency Module

The radio-frequency module 100 according to the first embodiment includes the mount board 9, the acoustic wave filter 1, the metal block 3, the resin layer 5, and the shield layer 6. The mount board 9, which has the first principal surface 91 and the second principal surface 92 which are opposite to each other, includes the ground layer 94. The acoustic wave filter 1 is mounted on the first principal surface 91 of the mount board 9. The metal block 3, which is disposed on the first principal surface 91 of the mount board 9, is connected to the ground layer 94. The resin layer 5, which is disposed on the first principal surface 91 of the mount board 9, covers the periphery 13 of the acoustic wave filter 1 and the periphery 33 of the metal block 3. The shield layer 6 covers the principal surface 12, which is on the opposite side to the mount board 9 side, of the acoustic wave filter 1, the resin layer 5, and the metal block 3. The metal block 3 is in contact with the shield layer 6.

In the radio-frequency module 100 according to the first embodiment, the metal block 3, which is connected to the ground layer 94 of the mount board 9, is in contact with the shield layer 6, enabling the improved shielding to be achieved. In the radio-frequency module 100 according to the first embodiment, the metal block 3 is in contact with the shield layer 6, achieving improved shielding of the shield layer 6.

In the radio-frequency module 100 according to the first embodiment, the acoustic wave filter 1 is in contact with the shield layer 6, enabling improved heat dissipation to be achieved. In the radio-frequency module 100 according to the first embodiment, the heat, which is produced by the acoustic wave filter 1 and which propagates to the shield layer 6, is easy to propagate to the metal block 3, enabling further improved heat dissipation to be achieved. In the radio-frequency module 100 according to the first embodiment, the shield layer 6 is preferably in contact with the entire area of the principal surface 12, which is on the opposite side to the mount board 9 side, of the acoustic wave filter 1 in terms of improvement of the heat dissipation. However, it is not necessary for the shield layer 6 to be in contact with the entire area of the principal surface 12 of the acoustic wave filter 1.

In the radio-frequency module 100 according to the first embodiment, the heat produced by the acoustic wave filter 1 may be dissipated through the shield layer 6. Thus, the radio-frequency module 100 according to the first embodiment achieves the suppression of an increase of the temperature of the substrate, having piezoelectricity, included in the acoustic wave filter 1. Therefore, the radio-frequency module 100 according to the first embodiment enables the stable temperature characteristics of the acoustic wave filter 1 to be achieved, and enables the stable characteristics of the radio-frequency module 100 to be achieved.

In the radio-frequency module 100 according to the first embodiment, the acoustic wave filter 1 is the transmit filter 112A. The heat from the transmit filter 112A is difficult to propagate to the receive filter 122A connected to the transmit filter 112A, enabling the suppression of the degradation of the characteristics of the receive filter 122A. In addition, the radio-frequency module 100 according to the first embodiment enables the suppression of the degradation of the characteristics of isolation between the transmit filter 112A and the receive filter 122A.

In the radio-frequency module 100 according to the first embodiment, the electronic components 2, which are positioned on the opposite side to the acoustic wave filter 1 when viewed from the metal block 3, include the receive filter 122A, the IC chip 120 including the low-noise amplifier 121, the inductor L3 of the input matching circuit 123, and the third switch 106. This enables the radio-frequency module 100 according to the first embodiment to have improved isolation between the acoustic wave filter 1 and the electronic components 2. More specifically, the state in which transmit signals, passing through the acoustic wave filter 1, affect the electronic components 2 (the state in which the transmit signals jump to the electronic components 2) may be suppressed.

In the radio-frequency module 100 according to the first embodiment, each of the principal surface 12 of the acoustic wave filter 1 and the surface 31 of the metal block 3 has a coarser surface than the principal surfaces, which are on the opposite side to the mount board 9 side, of the electronic components 2 covered by the resin layer 5. This enables the radio-frequency module 100 according to the first embodiment to have improved adhesiveness between the shield layer 6, and the acoustic wave filter 1 and the metal block 3. In addition, in the radio-frequency module 100 according to the first embodiment, unwanted waves (for example, unwanted bulk waves), which propagate in the direction parallel to the thickness direction, in a lithium niobate substrate or a lithium tantalate substrate forming the substrate, having piezoelectricity, included in the acoustic wave filter 1 may be dispersed at the interface between the shield layer 6 and the substrate having piezoelectricity, achieving the improvement of the filter characteristics of the acoustic wave filter 1. Examples of the improvement of the filter characteristics include the suppression of the harmonic distortion.

(3.2) The Communication Device

The communication device 300 according to the first embodiment includes the signal processing circuit 301 and the radio-frequency module 100. The signal processing circuit 301 is connected to the radio-frequency module 100.

The communication device 300 according to the first embodiment, which includes the radio-frequency module 100, enables the improved shielding to be achieved.

The circuit components included in the signal processing circuit 301 may be mounted, for example, on the circuit board, or may be mounted on a circuit board (second circuit board) different from the circuit board (first circuit board) on which the radio-frequency module 100 is mounted.

Second Embodiment

Figure 4:
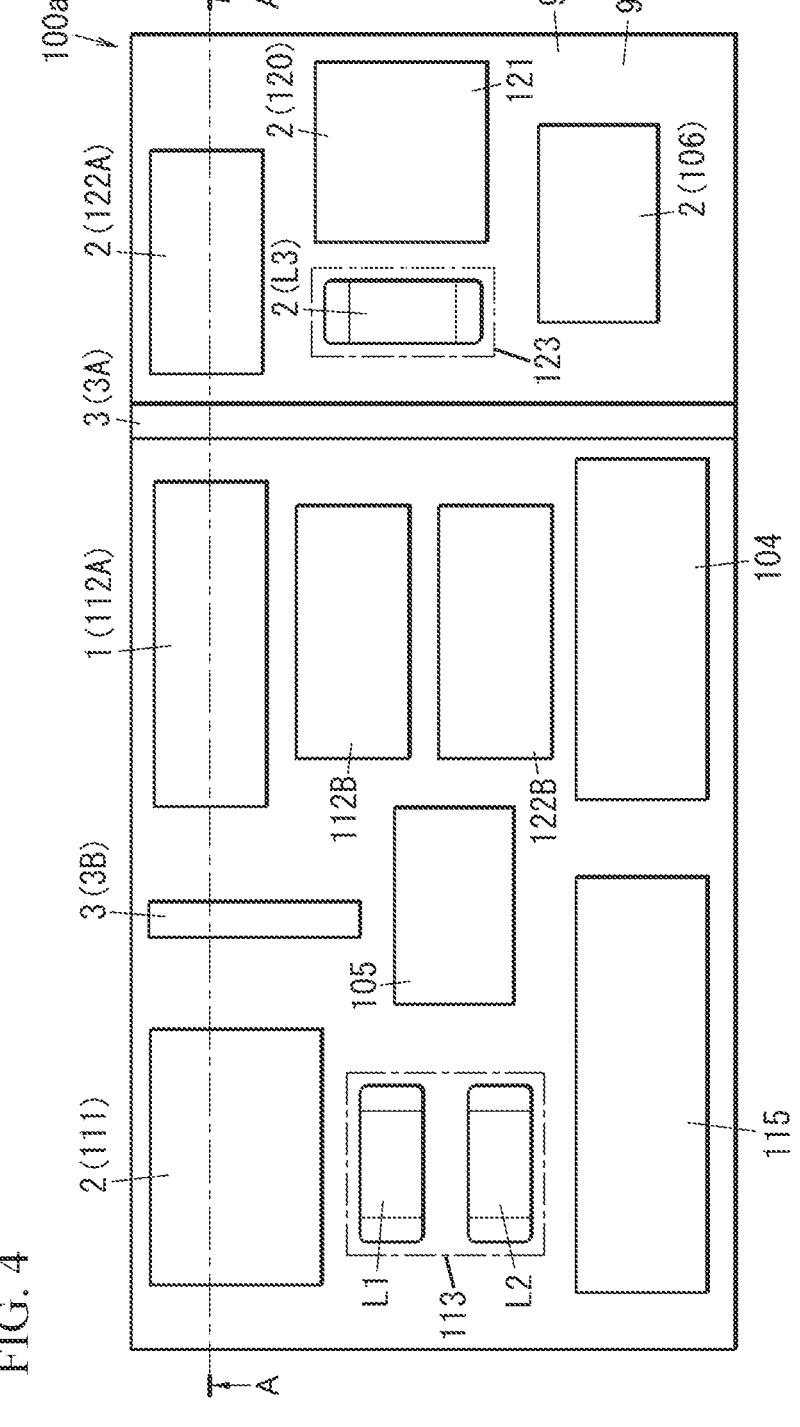
FIG. 4 is a plan view, in which a shield layer and a resin layer are not illustrated, of a radio-frequency module according to a second embodiment.
Figure 5:
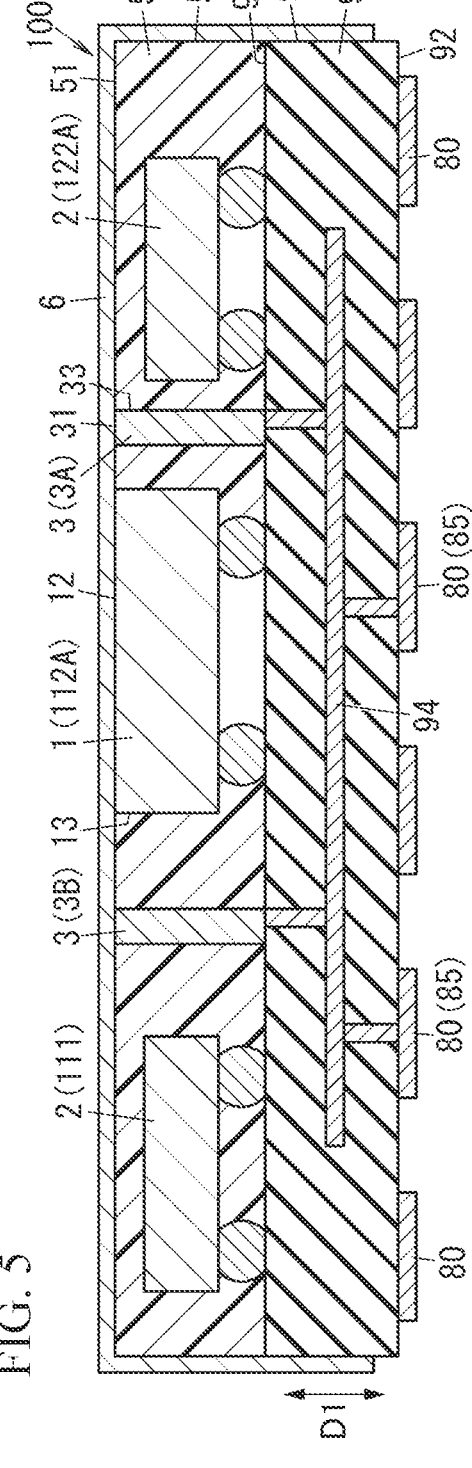
FIG. 5 is a cross-sectional view of the radio-frequency module along line A-A in FIG. 4.

A radio-frequency module 100a according to a second embodiment will be described by referring to FIGS. 4 and 5. Components of the radio-frequency module 100a according to the second embodiment, which are substantially the same as those of the radio-frequency module 100 according to the first embodiment, are designated with the same reference numerals, and will not be described. The circuit configuration of the radio-frequency module 100a is substantially the same as that of the radio-frequency module 100 according the first embodiment which is described by referring to FIG. 3.

The radio-frequency module 100a according to the second embodiment is different from the radio-frequency module 100 according to the first embodiment in that multiple (in the illustrated example, two) metal blocks 3 are included. In the description below, among the metal blocks 3, a metal block 3, which is disposed between the acoustic wave filter 1, and the receive filter 122A, the inductor L3, the IC chip 120, and the third switch 106, may be also referred to as a first metal block 3A; a metal block 3, which is disposed between the acoustic wave filter 1 and the power amplifier 111, may be also referred to as a second metal block 3B.

In the radio-frequency module 100a according to the second embodiment, each of the receive filter 122A, the IC chip 120 including the low-noise amplifier 121, the inductor L3 of the input matching circuit 123, and the third switch 106 forms an electronic component 2, which is positioned on the opposite side to the acoustic wave filter 1 when viewed from the first metal block 3A.

In the radio-frequency module 100a according to the second embodiment, the power amplifier 111 forms an electronic component 2 which is positioned on the opposite side to the acoustic wave filter 1 when viewed from the second metal block 3B. In the radio-frequency module 100a according to the second embodiment, the power amplifier 111 is adjacent to the second metal block 3B. The expression, "The power amplifier 111 is adjacent to the second metal block 3B." means that, in plan view in the thickness direction D1 of the mount board 9, no other circuit components are present between the power amplifier 111 and the second metal block 3B, and that the power amplifier 111 is next to the second metal block 3B.

In the radio-frequency module 100a according to the second embodiment, in the direction in which the second metal block 3B and the first metal block 3A are lined up, the power amplifier 111, the second metal block 3B, the acoustic wave filter 1 (transmit filter 112A), the first metal block 3A, and the receive filter 122A are lined up in the order of the power amplifier 111, the second metal block 3B, the acoustic wave filter 1 (transmit filter 112A), the first metal block 3A, and the receive filter 122A. The acoustic wave filter 1 (transmit filter 112A) and the transmit filter 112B are positioned on the opposite side to the power amplifier 111 when viewed from the second metal block 3B. In the radio-frequency module 100a according to the second embodiment, in plan view in the thickness direction D1 of the mount board 9, the second metal block 3B is positioned between the transmit filter 112B and the power amplifier 111. In the radio-frequency module 100a according to the second embodiment, in plan view in the thickness direction D1 of the mount board 9, the power amplifier 111 is adjacent to (the inductor L1 of) the output matching circuit 113 in the direction orthogonal to the direction in which the second metal block 3B and the first metal block 3A are lined up. In the radio-frequency module 100a according to the second embodiment, the power amplifier 111, the output matching circuit 113, and the controller 115 are line up in the order of the power amplifier 111, the output matching circuit 113, and the controller 115.

In the radio-frequency module 100a according to the second embodiment, the metal blocks 3, which are connected to the ground layer 94 of the mount board 9, are in contact with the shield layer 6, enabling the improved shielding to be achieved compared with the radio-frequency module 100 according to the first embodiment. In the radio-frequency module 100a according to the second embodiment, the length of the first metal block 3A is longer than that of the metal block 3 in the radio-frequency module 100 according to the first embodiment, and is substantially the same as that, in the short-side direction, of the mount board 9. In the radio-frequency module 100a, a first end face and a second end face, in the longitudinal direction, of the first metal block 3A are not covered by the first resin layer 5, and are in contact with the shield layer 6. This enables the radio-frequency module 100a according to the second embodiment to achieve further improved shielding.

Like the radio-frequency module 100 according to the first embodiment, the radio-frequency module 100a according to the second embodiment, in which the principal surface 12 of the acoustic wave filter 1 is in contact with the shield layer 6, enables the suppression of an increase of the temperature of the acoustic wave filter 1.

In the radio-frequency module 100a according to the second embodiment, the electronic component 2, which is positioned on the opposite side to the acoustic wave filter 1 when viewed from the second metal block 3B, includes the power amplifier 111. This makes the heat, which is produced by the power amplifier 111, difficult to propagate to the acoustic wave filter 1, achieving the suppression of an increase of the temperature of the substrate, having piezo-electricity, included in the acoustic wave filter 1.

In the radio-frequency module 100a according to the second embodiment, the power amplifier 111 is adjacent to the second metal block 3B. Thus, the state in which the signals from the power amplifier 111 affect the other electronic components 2 (the state in which the signals jump to the electronic components 2) may be suppressed.

Third Embodiment

Figure 6:
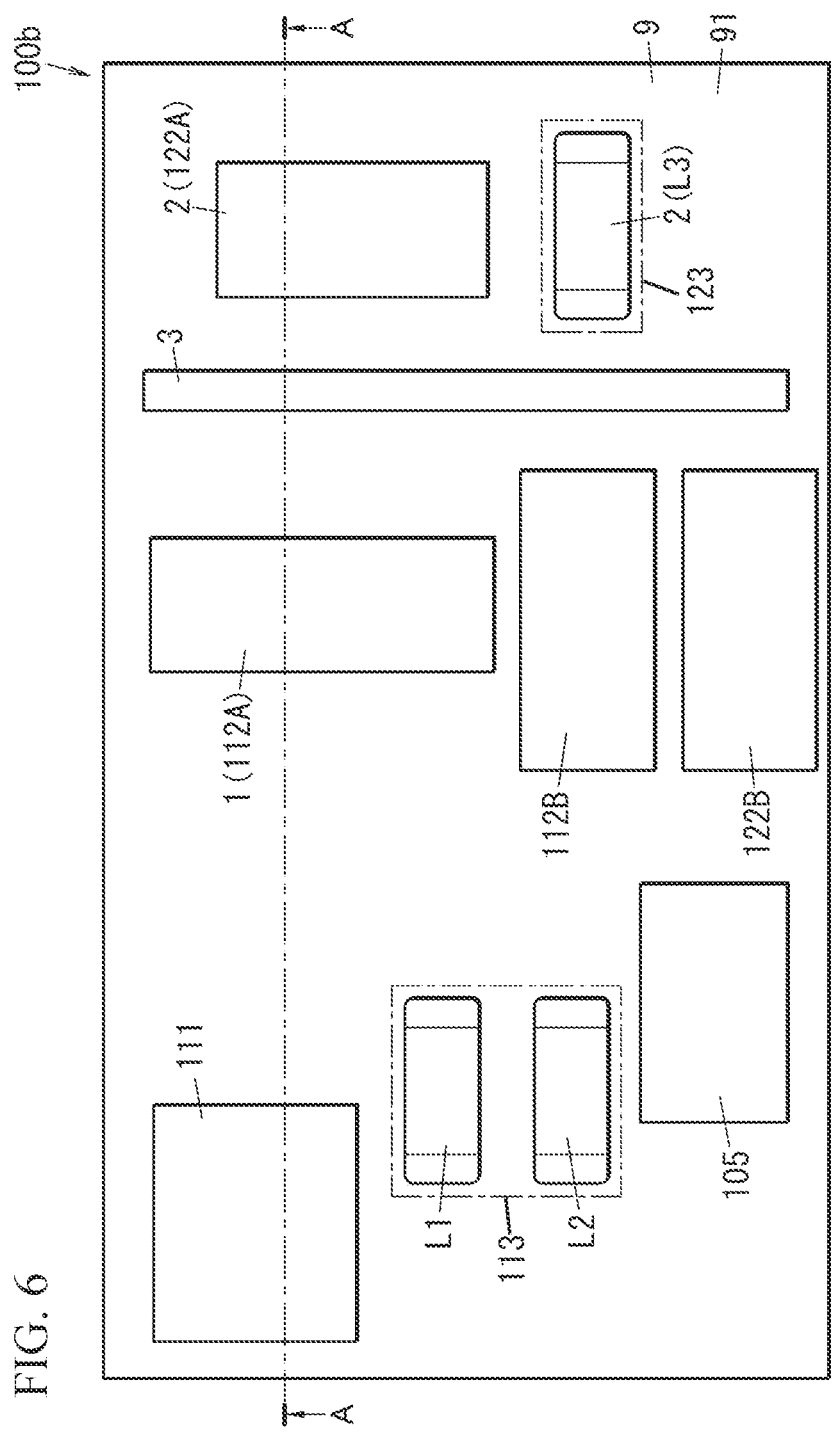
FIG. 6 is a plan view, in which a shield layer and a resin layer are not illustrated, of a radio-frequency module according to a third embodiment.
Figure 7:
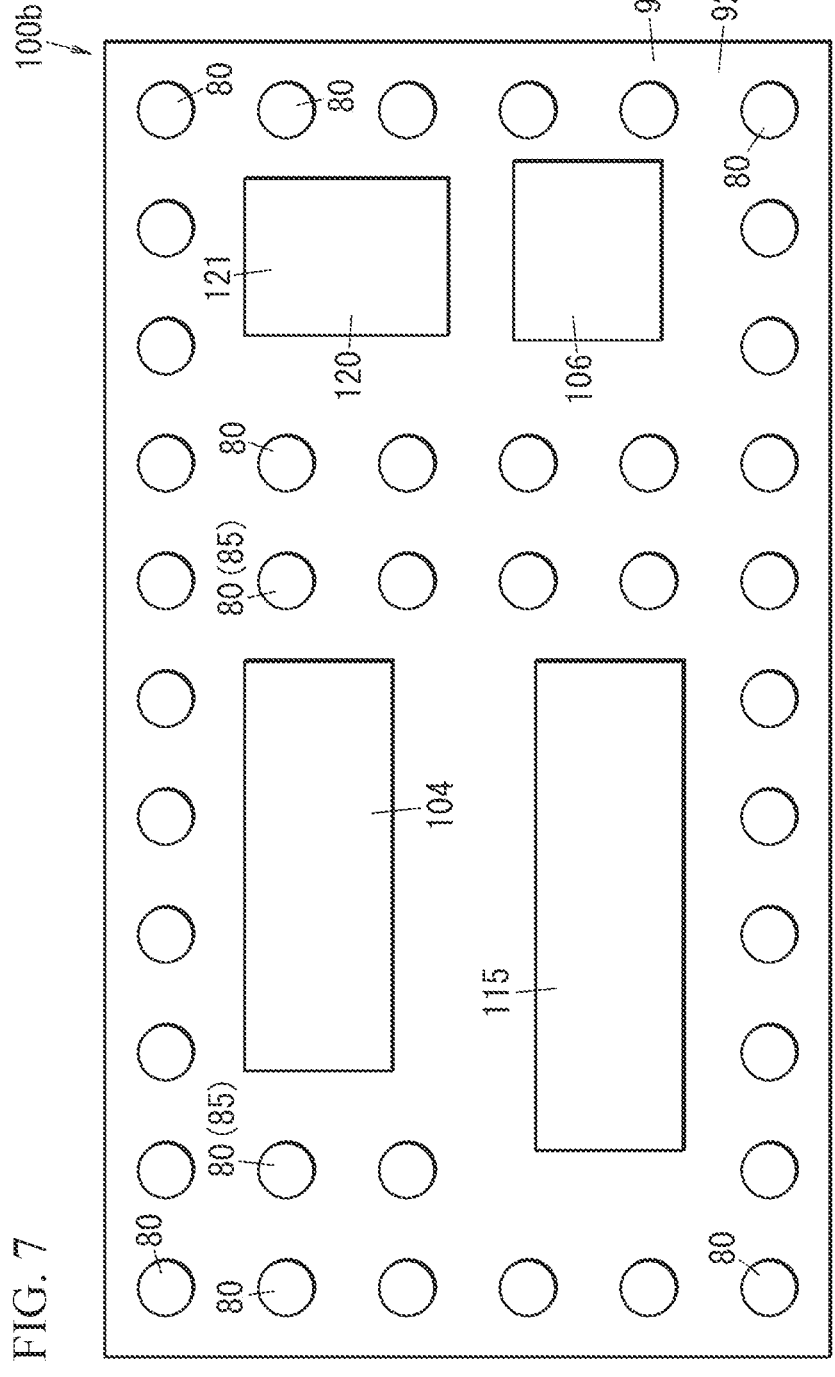
FIG. 7 is a plan view which relates to the radio-frequency module and in which a second principal surface of a mount board, and circuit components and multiple external connection terminals, which are disposed on the second principal surface of the mount board, are viewed through from the first principal surface side of the mount board.
Figure 8:
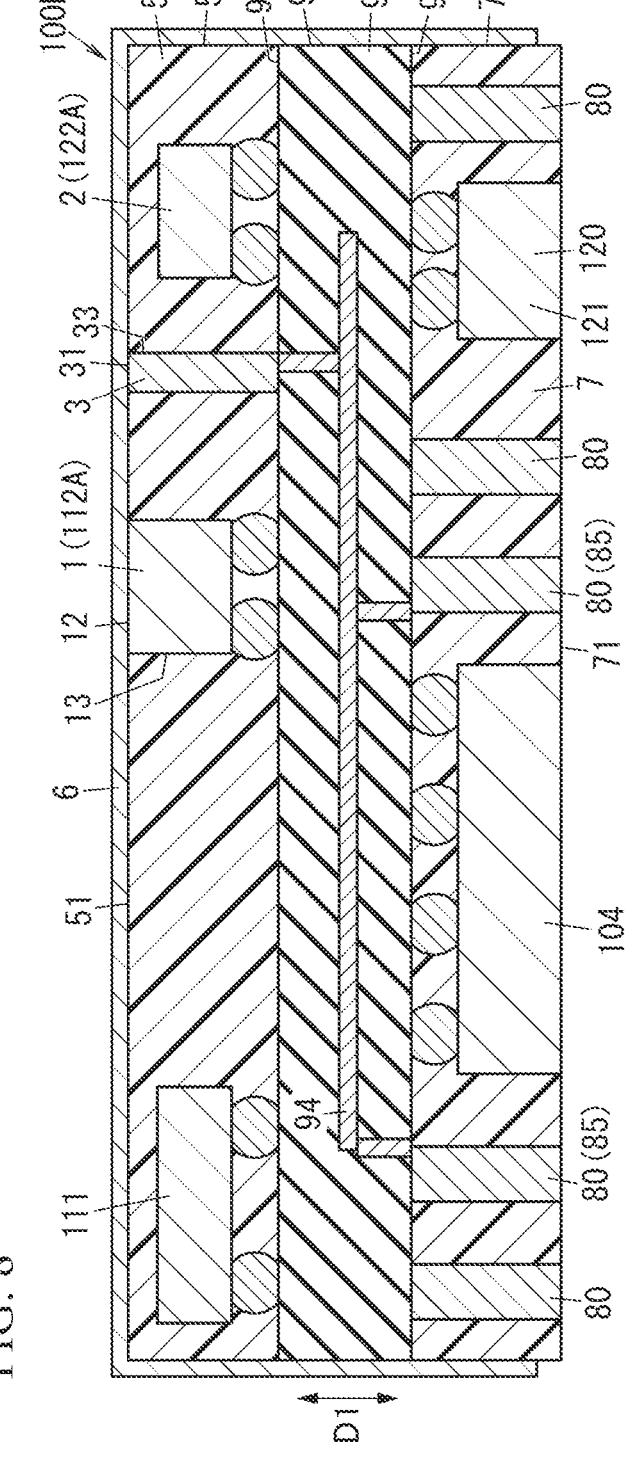
FIG. 8 is a cross-sectional view of the radio-frequency module along line A-A in FIG. 6.

A radio-frequency module 100b according to a third embodiment will be described by referring to FIGS. 6 to 8. Components of the radio-frequency module 100b according to the third embodiment, which are substantially the same as those of the radio-frequency module 100 according to the first embodiment, are designated with the same reference numerals, and will not be described. The circuit configuration of the radio-frequency module 100b is substantially the same as that of the radio-frequency module 100 according to the first embodiment which is described by referring to FIG. 3.

The radio-frequency module 100b according to the third embodiment is different from the radio-frequency module 100 according to the first embodiment in that the IC chip 120 including the low-noise amplifier 121 is mounted on the second principal surface 92 of the mount board 9. The radio-frequency module 100b according to the third embodiment is also different from the radio-frequency module 100 according to the first embodiment in that the first switch 104, the third switch 106, and the controller 115 are mounted on the second principal surface 92 of the mount board 9.

In addition, the radio-frequency module 100b according to the third embodiment is different from the radio-frequency module 100 according to the first embodiment in that each of the external connection terminals 80 is a pillar-shaped electrode. The pillar-shaped electrode is, for example, a columnar electrode. The external connection terminals 80 are joined to the conductive portions of the mount board 9, for example, by using solder. However, the configuration is not limited to this. For example, the external connection terminals 80 may be joined by using a conductive adhesive (for example, a conductive paste), or may be joined directly.

The radio-frequency module 100b according to the third embodiment further includes a resin layer 7 (hereinafter also referred to as a second resin layer 7) other than the resin layer 5 (hereinafter also referred to as the first resin layer 5) disposed on the first principal surface 91 of the mount board 9. The second resin layer 7 covers the periphery of each of the circuit components (the IC chip 120, the first switch 104, the third switch 106, and the controller 115) mounted on the second principal surface 92 of the mount board 9, and the periphery of each of the external connection terminals 80.

The second resin layer 7 is formed so that the principal surface, which is on the opposite side to the mount board 9 side, of each of the circuit components mounted on the second principal surface 92 of the mount board 9 is exposed. The second resin layer 7 contains a resin (for example, an epoxy resin). The second resin layer 7 may contain a filler in addition to a resin. The material of the second resin layer 7 may be the same as that of the first resin layer 5, or may be a different material.

In the radio-frequency module 100b, the shield layer 6 also covers the periphery 73 of the second resin layer 7.

In the radio-frequency module 100b, the principal surfaces, which are on the opposite side to the mount board 9 side, of the circuit components mounted on the second principal surface 92 of the mount board 9 are substantially flush with a principal surface 71, which is on the opposite side to the mount board 9 side, of the resin layer 7.

Like the radio-frequency module 100 according to the first embodiment, the radio-frequency module 100b according to the third embodiment, in which the metal block 3 connected to the ground layer 94 of the mount board 9 is in contact with the shield layer 6, enables the improved shielding to be achieved.

Like the radio-frequency module 100 according to the first embodiment, the radio-frequency module 100b according to the third embodiment, in which the principal surface 12 of the acoustic wave filter 1 is in contact with the shield layer 6, enables the suppression of an increase of the temperature of the acoustic wave filter 1.

In the radio-frequency module 100b according to the third embodiment, the IC chip 120 including the low-noise amplifier 121 is mounted on the second principal surface 92 of the mount board 9. The acoustic wave filter 1 (transmit filter 112A) does not overlap the IC chip 120 in plan view in the thickness direction D1 of the mount board 9. Therefore, the radio-frequency module 100b according to the third embodiment enables the isolation between the acoustic wave filter 1 and the low-noise amplifier 121 to be improved. In the radio-frequency module 100b according to the third embodiment, in plan view in the thickness direction D1 of the mount board 9, the IC chip 120 is positioned on the opposite side to the acoustic wave filter 1 when viewed from the metal block 3, enabling the isolation between the acoustic wave filter 1 and the low-noise amplifier 121 to be further improved.

In the radio-frequency module 100b according to the third embodiment, the power amplifier 111 does not overlap the IC chip 120 in plan view in the thickness direction D1 of the mount board 9. Therefore, the radio-frequency module 100b according to the third embodiment enables the isolation between the power amplifier 111 and the low-noise amplifier 121 to be improved.

In the radio-frequency module 100b according to the third embodiment, the second resin layer 7 is formed so that the principal surface, which is on the opposite side to the mount board 9 side, of each of the circuit components (the IC chip 120, the first switch 104, the third switch 106, and the controller 115) mounted on the second principal surface 92 of the mount board 9 is exposed. This enables the radio-frequency module 100b according to the third embodiment to achieve a reduction in profile in the configuration in which circuit components are disposed also on the second principal surface 92 of the mount board 9.

Fourth Embodiment

Figure 9:
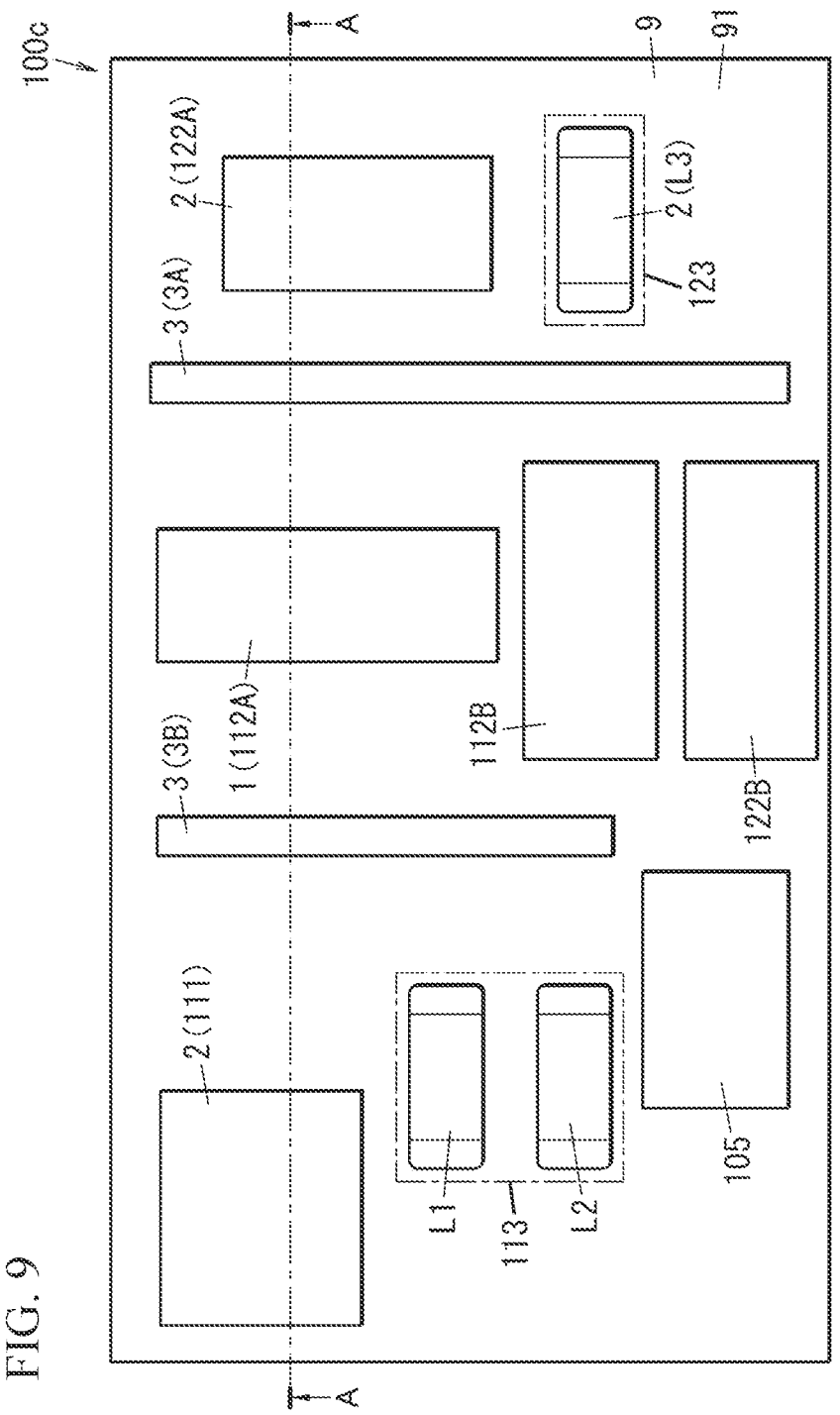
FIG. 9 is a plan view, in which a shield layer and a resin layer are not illustrated, of a radio-frequency module according to a fourth embodiment.
Figure 10:
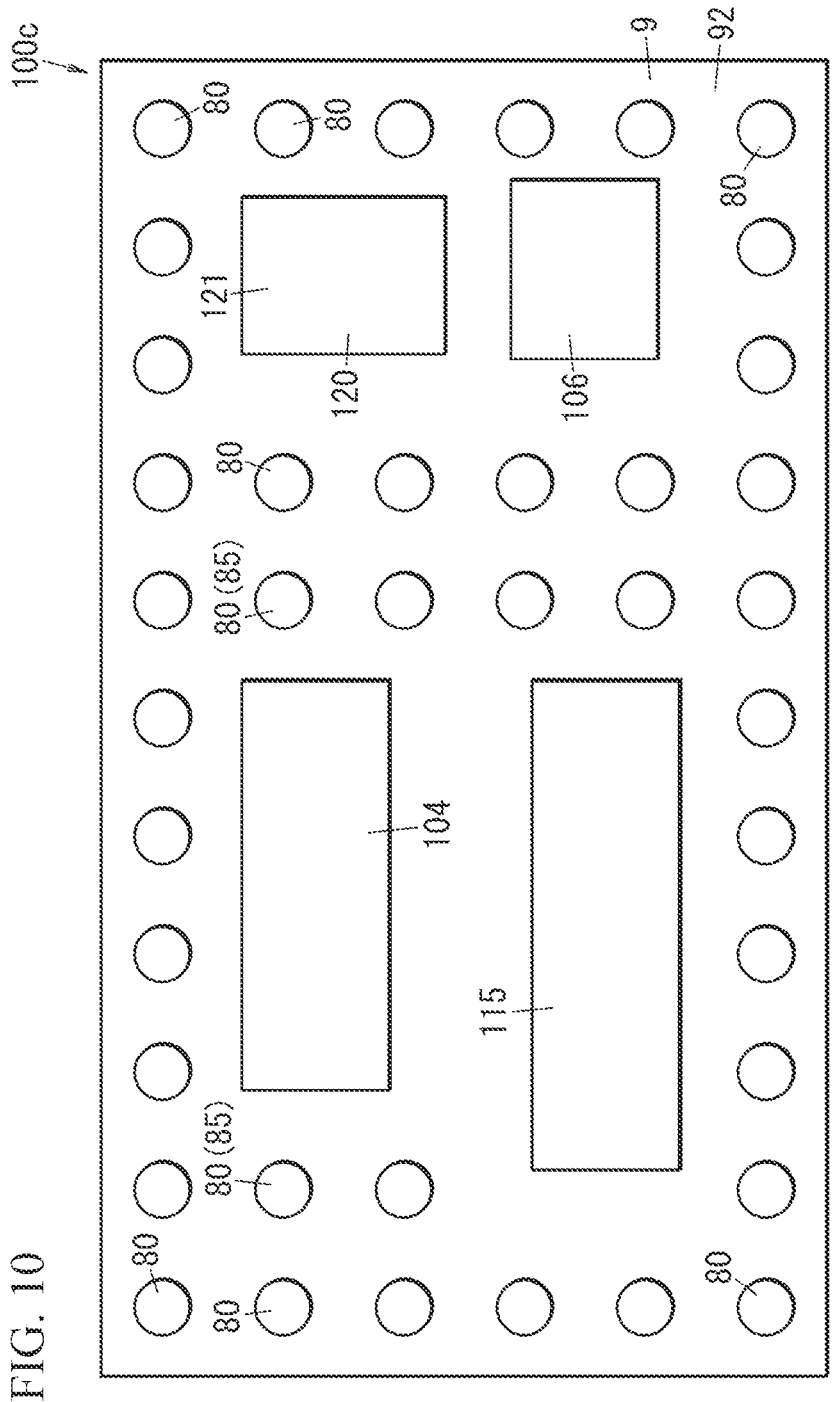
FIG. 10 is a plan view which relates to the radio-frequency module and in which a second principal surface of a mount board, and circuit components and multiple external connection terminals, which are disposed on the second principal surface of the mount board, are viewed through from the first principal surface side of the mount board.
Figure 11:
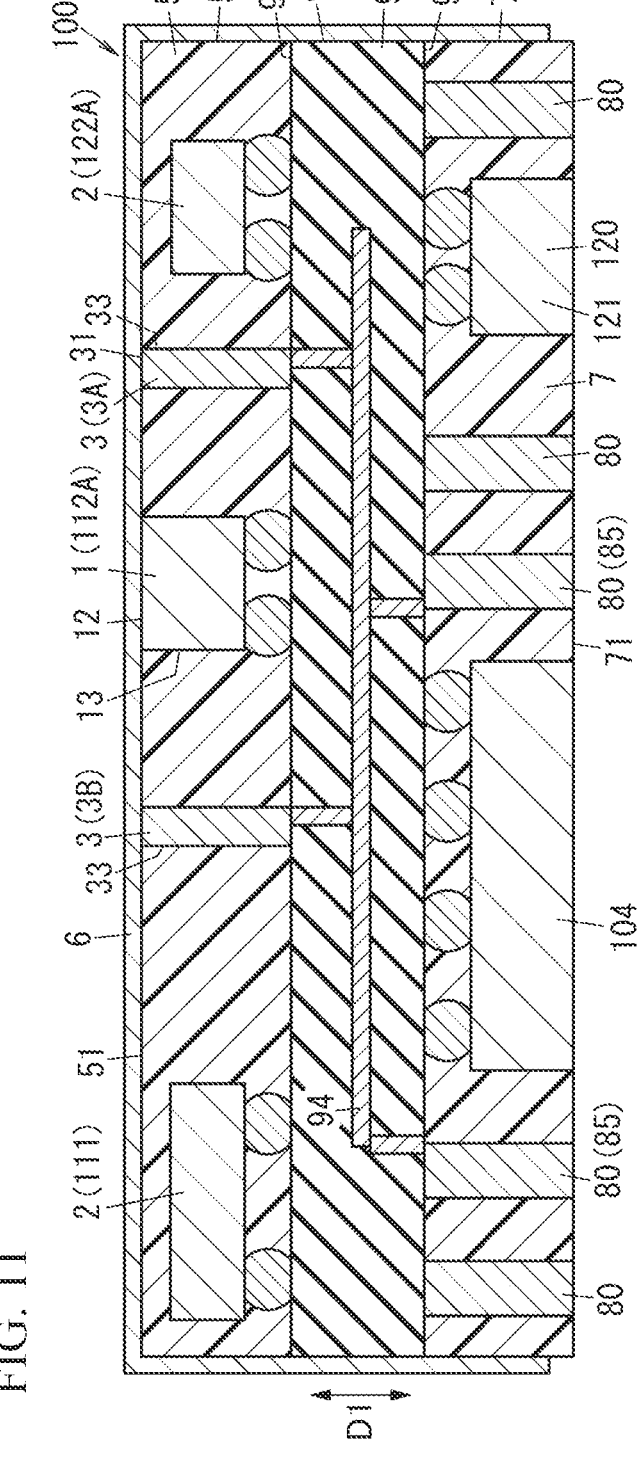
FIG. 11 is a cross-sectional view of the radio-frequency module along line A-A in FIG. 9.

A radio-frequency module 100c according to a fourth embodiment will be described by referring to FIGS. 9 to 11. Components of the radio-frequency module 100c according to the fourth embodiment, which are substantially the same as those of the radio-frequency module 100b according to the third embodiment, are designated with the same reference numerals, and will not be described. The circuit configuration of the radio-frequency module 100c is substantially the same as that of the radio-frequency module 100 according to the first embodiment which is described by referring to FIG. 3.

The radio-frequency module 100c according to the fourth embodiment is different from the radio-frequency module 100b according to the third embodiment in that multiple (in the illustrated example, two) metal blocks 3 are included. In the description below, among the metal blocks 3, a metal block 3, which is disposed between the acoustic wave filter 1, and the receive filter 122A and the inductor L3, may be referred to as the first metal block 3A; a metal block 3, which is disposed between the acoustic wave filter 1 and the power amplifier 111 may be referred to as the second metal block 3B.

In the radio-frequency module 100c according to the fourth embodiment, each of the receive filter 122A and the inductor L3 of the input matching circuit 123 forms an electronic component 2 positioned on the opposite side to the acoustic wave filter 1 when viewed from the first metal block 3A.

In the radio-frequency module 100c according to the fourth embodiment, the power amplifier 111 forms an electronic component 2 positioned on the opposite side to the acoustic wave filter 1 when viewed from the second metal block 3B. In the radio-frequency module 100c according to the fourth embodiment, the power amplifier 111 is adjacent to the second metal block 3B. The expression, "The power amplifier 111 is adjacent to the second metal block 3B." means that, in plan view in the thickness direction D1 of the mount board 9, no other circuit components are present between the power amplifier 111 and the second metal block 3B, and that the power amplifier 111 is next to the second metal block 3B.

In the radio-frequency module 100c according to the fourth embodiment, in the direction in which the second metal block 3B and the first metal block 3A are lined up, the power amplifier 111, the second metal block 3B, the acoustic wave filter 1 (transmit filter 112A), the first metal block 3A, and the receive filter 122A are lined up in the order of the power amplifier 111, the second metal block 3B, the acoustic wave filter 1 (transmit filter 112A), the first metal block 3A, and the receive filter 122A. The acoustic wave filter 1 (transmit filter 112A) and the transmit filter 112B are positioned on the opposite side to the power amplifier 111 when viewed from the second metal block 3B. In the radio-frequency module 100c according to the fourth embodiment, the second metal block 3B is positioned between the transmit filter 112B and the power amplifier 111 in plan view in the thickness direction D1 of the mount board 9. In the radio-frequency module 100c according to the fourth embodiment, in plan view in the thickness direction D1 of the mount board 9, the power amplifier 111 is adjacent to (the inductor L1 of) the output matching circuit 113 in the direction orthogonal to the direction in which the second metal block 3B and the first metal block 3A are lined up.

In the radio-frequency module 100c according to the fourth embodiment, the metal blocks 3 connected to the ground layer 94 of the mount board 9 are in contact with the shield layer 6, enabling the improved shielding to be achieved compared with the radio-frequency module 100b according to the third embodiment.

Like the radio-frequency module 100b according to the third embodiment, the radio-frequency module 100c according to the fourth embodiment, in which the principal surface 12 of the acoustic wave filter 1 is in contact with the shield layer 6, enables the suppression of an increase of the temperature of the acoustic wave filter 1.

The radio-frequency module 100c according to the fourth embodiment includes the power amplifier 111 as an electronic component 2 positioned on the opposite side to the acoustic wave filter 1 when viewed from the second metal block 3B. Thus, the heat produced by the power amplifier 111 is difficult to propagate to the acoustic wave filter 1, achieving the suppression of an increase of the temperature of the substrate, having piezoelectricity, included in the acoustic wave filter 1.

In the radio-frequency module 100c according to the fourth embodiment, the power amplifier 111 is adjacent to the second metal block 3B, enabling the suppression of the state in which the signals from the power amplifier 111 affect the other electronic components 2 (the state in which the signals jump to the other electronic components 2).

Fifth Embodiment

Figure 12:
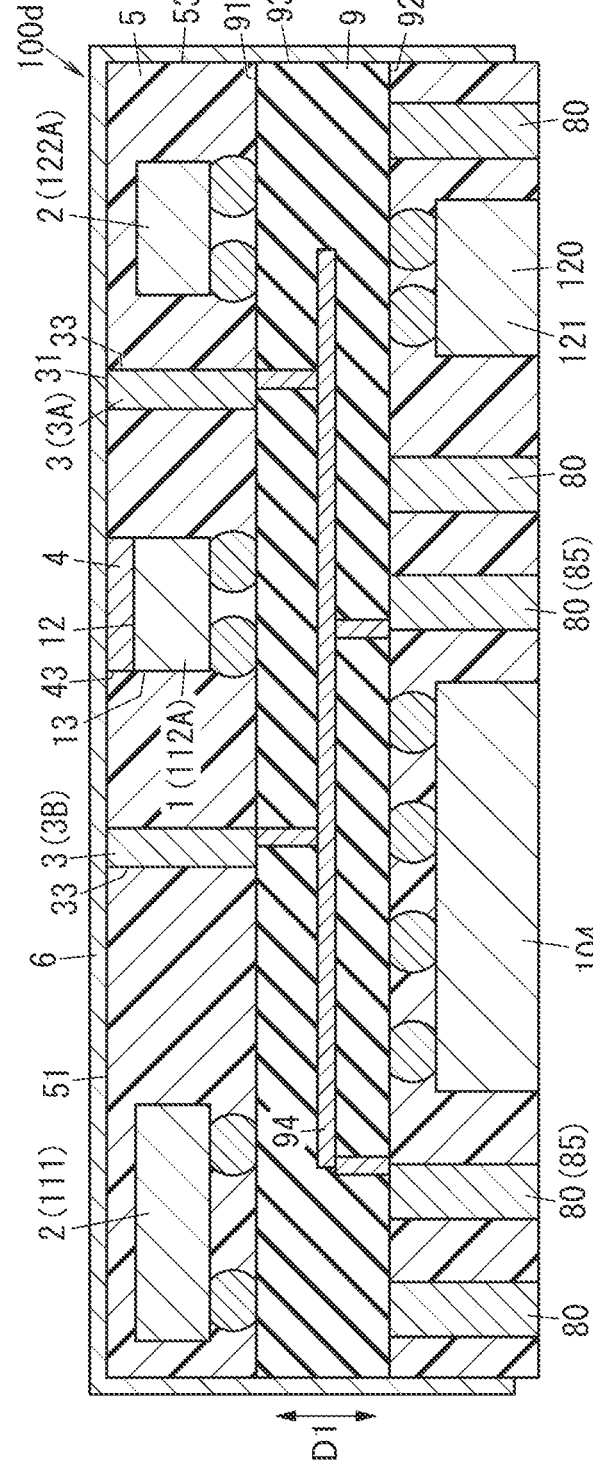
FIG. 12 is a cross-sectional view of a radio-frequency module according to a fifth embodiment.

A radio-frequency module 100d according to a fifth embodiment will be described by referring to FIG. 12. Components of the radio-frequency module 100d according to the fifth embodiment, which are substantially the same as those of the radio-frequency module 100c according to the fourth embodiment, are designated with the same reference numerals, and will not be described. The circuit configuration of the radio-frequency module 100d is substantially the same as that of the radio-frequency module 100 according to the first embodiment which is described by referring to FIG. 3.

The radio-frequency module 100d according to the fifth embodiment is different from the radio-frequency module 100c according to the fifth embodiment in that a metal member 4 is further included. The metal member 4 is disposed on the principal surface 12, which is on the opposite side to the mount board 9 side, of the acoustic wave filter 1.

The resin layer 5, which is disposed on the first principal surface 91 of the mount board 9, covers the periphery 13 of the acoustic wave filter 1, the periphery 43 of the metal member 4, and the periphery 33 of each of the metal blocks 3. The shield layer 6 covers the resin layer 5, the metal member 4, and the metal blocks 3. The metal blocks 3 are in contact with the shield layer 6. The metal member 4 is in contact with the shield layer 6.

In plan view in the thickness direction D1 of the mount board 9, the metal member 4 is quadrate. However, the configuration is not limited to this. In plan view in the thickness direction D1 of the mount board 9, the metal member 4 has the same size as the acoustic wave filter 1. However, the configuration is not limited to this. The metal member 4 may be larger than the acoustic wave filter 1, or may be smaller than the acoustic wave filter 1. The material of the metal member 4 is, for example, copper or a copper alloy. The metal member 4 may be joined to the principal surface 12 of the acoustic wave filter 1, or may be just in contact with the principal surface 12.

In the radio-frequency module 100d according to the fifth embodiment, the metal blocks 3 connected to the ground layer 94 of the mount board 9 are in contact with the shield layer 6, enabling the improved shielding to be achieved. The radio-frequency module 100d according to the fifth embodiment includes the multiple metal blocks 3, enabling further improved shielding to be achieved.

Sixth Embodiment

Figure 13:
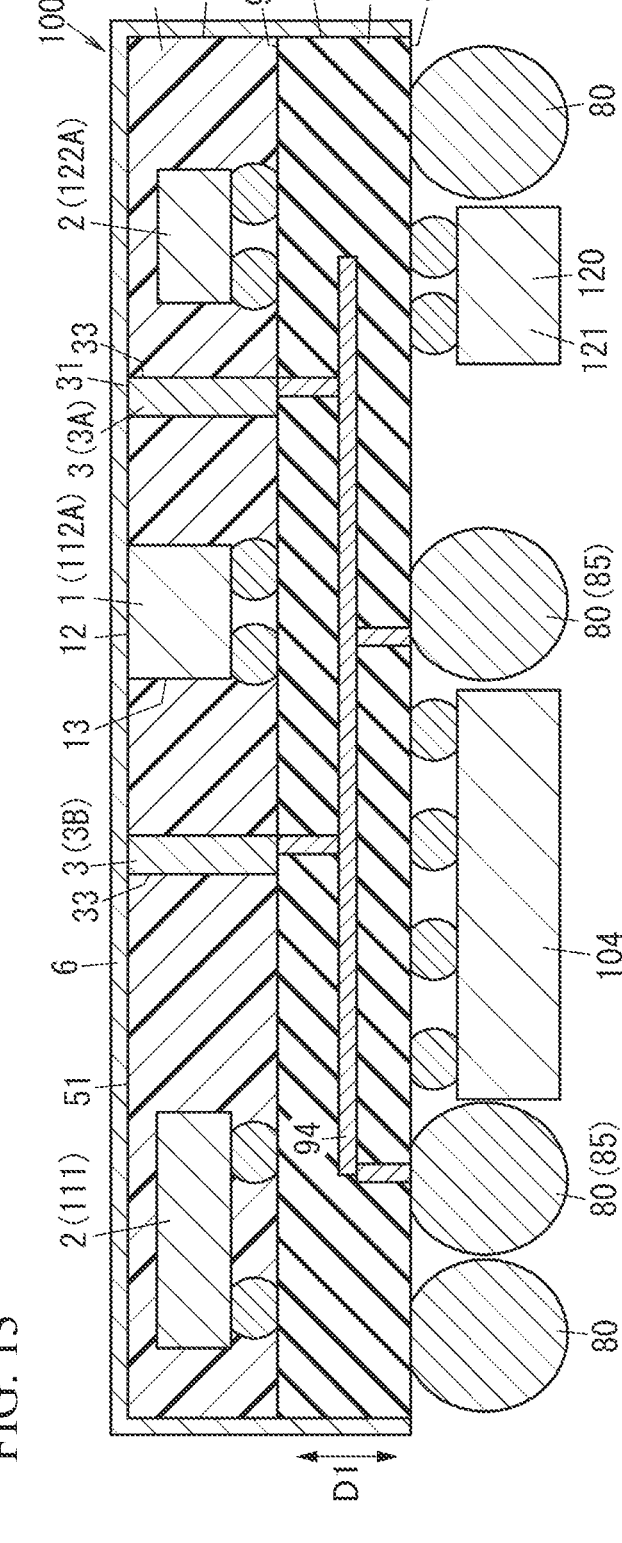
FIG. 13 is a cross-sectional view of a radio-frequency module according to a sixth embodiment.

A radio-frequency module 100e according to a sixth embodiment will be described by referring to FIG. 13.

Components of the radio-frequency module 100e according to the sixth embodiment, which are substantially the same as those of the radio-frequency module 100d according to the fifth embodiment, are designated with the same reference numerals, and will not be described.

The radio-frequency module 100e according to the sixth embodiment is different from the radio-frequency module 100d according to the fifth embodiment in that the external connection terminals 80 are ball bumps. The radio-frequency module 100e according to the sixth embodiment is different from the radio-frequency module 100d according to the fifth embodiment in that the resin layer 7 in the radio-frequency module 100d according to the fifth embodiment is not included. The radio-frequency module 100e according to the sixth embodiment may include underfill portions disposed in gaps between the second principal surface 92 of the mount board 9 and the circuit components mounted on the second principal surface 92 of the mount board 9.

The material of the ball bumps forming the external connection terminals 80 is, for example, gold, copper, or solder.

The external connection terminals 80 may be a mixture of external connection terminals 80, which are formed as ball bumps, and external connection terminals 80, which are formed as pillar-shaped electrodes.

Like the radio-frequency module 100d according to the fifth embodiment, the radio-frequency module 100e according to the sixth embodiment, in which the metal blocks 3 connected to the ground layer 94 of the mount board 9 are in contact with the shield layer 6, enables the improved shielding to be achieved.

Modified Examples

The first to sixth embodiments and the like, described above, are merely various exemplary embodiments of the present disclosure. Various changes may be made to the first to sixth embodiments and the like in accordance with design or the like as long as the possible benefit of the present disclosure is achieved.

Each of the transmit filter 112A (acoustic wave filter 1), the transmit filter 112B, the receive filter 122A, and the receive filter 122B is not limited to a bare-chip acoustic wave filter, and may have a packaging structure.

Each of the transmit filter 112A (acoustic wave filter 1), the transmit filter 112B, the receive filter 122A, and the receive filter 122B is not limited to a surface acoustic wave filter, and may be, for example, a BAW (Bulk Acoustic Wave) filter. A resonator in a BAW filter is, for example, a FBAR (Film Bulk Acoustic Resonator) or an SMR (Solidly Mounted Resonator).

As for filters, such as the transmit filters 112A and 112B and the receive filters 122A and 122B, each of the transmit filter 112A (acoustic wave filter 1), the transmit filter 112B, the receive filter 122A, and the receive filter 122B is not limited to a ladder filter, and may be, for example, a longitudinally-coupled resonator-type surface acoustic wave filter.

The acoustic wave filter described above is an acoustic wave filter using surface acoustic waves or bulk acoustic waves. However, the configuration is not limited to this. For example, the acoustic wave filter may be an acoustic wave filter using boundary acoustic waves, plate waves, or the like.

The acoustic wave filter 1 is electrically connected to the mount board 9 through conductive bumps. The electrical connection, to the mount board 9, of circuit components other than the acoustic wave filter 1 among the circuit components mounted on the mount board 9 is not limited to the electrical connection through conductive bumps, and may be, for example, electrical connection to the mount board 9 through bonding wires.

The circuit configuration of the radio-frequency modules 100 to 100e is not limited to the example described above. The circuit configuration of the radio-frequency modules 100 to 100e may have, for example, a radio-frequency front-end circuit supporting MIMO (Multi Input Multi Output).

The communication device 300 according to the first embodiment may include any of the radio-frequency modules 100a, 100b, 100c, 100d, and 100e, instead of the radio-frequency module 100.

The IC chip 120 including the low-noise amplifier 121 may include, for example, at least one of the following components in addition to the low-noise amplifier 121: the first switch 104, the second switch 105, the third switch 106, and the controller 115.

(Aspects)

The aspects described below are disclosed in the specification.

A radio-frequency module (100; 100a; 100b; 100c; 100e) according to a first aspect includes a mount board (9), an acoustic wave filter (1), a metal block (3), a resin layer (5), and a shield layer (6). The mount board (9) has a first principal surface (91) and a second principal surface (92) which are opposite to each other, and has a ground layer (94). The acoustic wave filter (1) is mounted on the first principal surface (91) of the mount board (9). The metal block (3) is disposed on the first principal surface (91) of the mount board (9), and is connected to the ground layer (94). The resin layer (5) is disposed on the first principal surface (91) of the mount board (9), and covers the periphery (13) of the acoustic wave filter (1) and the periphery (33) of the metal block (3). The shield layer (6) covers a principal surface (12), which is on the opposite side to the mount board (9) side, of the acoustic wave filter (1), the resin layer (5), and the metal block (3). The metal block (3) is in contact with the shield layer (6).

The radio-frequency module (100; 100a; 100b; 100c; 100e) according to the first aspect enables the improved shielding to be achieved.

A radio-frequency module (100d) according to a second aspect includes a mount board (9), an acoustic wave filter (1), a metal member (4), a metal block (3), a resin layer (5), and a shield layer (6). The mount board (9) has a first principal surface (91) and a second principal surface (92) which are opposite to each other, and has a ground layer (94). The acoustic wave filter (1) is mounted on the first principal surface (91) of the mount board (9). The metal member (4) is disposed on a principal surface (12), which is on the opposite side to the mount board (9) side, of the acoustic wave filter (1). The metal block (3) is disposed on the first principal surface (91) of the mount board (9), and is connected to the ground layer (94). The resin layer (5) is disposed on the first principal surface (91) of the mount board (9), and covers the periphery (13) of the acoustic wave filter (1), the periphery (43) of the metal member (4), and the periphery (33) of the metal block (3). The shield layer (6) covers the resin layer (5), the metal member (4), and the metal block (3). The metal block (3) is in contact with the shield layer (6).

The radio-frequency module (100d) according to the second aspect enables the improved shielding to be achieved.

In the first or second aspect, the radio-frequency module (100; 100a; 100b; 100c; 100d; 100e) according to a third aspect further includes multiple external connection terminals (80). The external connection terminals (80) are disposed on the second principal surface (92) of the mount board (9). The external connection terminals (80) include a ground terminal (85) connected to the ground layer (94).

The radio-frequency module (100; 100a; 100b; 100c; 100d; 100e) according to the third aspect enables the improved shielding to be achieved.

According to the radio-frequency module (100; 100a; 100b; 100c; 100d; 100e) of a fourth aspect, in any one of the first to third aspects, the acoustic wave filter (1) is a transmit filter (112A).

The radio-frequency module (100; 100a; 100b; 100c; 100d; 100e) according to the fourth aspect enables suppression of leaking of radio-frequency signals (transmit signals) passing through the transmit filter (112A).

In the fourth aspect, the radio-frequency module (100; 100a; 100b; 100c; 100d; 100e) according to a fifth aspect further includes an electronic component (2). The electronic component (2) is mounted on the first principal surface (91) of the mount board (9). The electronic component (2) is positioned on the opposite side to the acoustic wave filter (1) when viewed from the metal block (3).

The radio-frequency module (100; 100a; 100b; 100c; 100d; 100e) according to the fifth aspect enables suppression of the state in which radio-frequency signals (transmit signals), passing through the transmit filter (112A), affect the electronic component (2).

According to the radio-frequency module (100; 100a; 100b; 100c; 100d; 100e) of a sixth aspect, in the fifth aspect, the electronic component (2) is a receive filter (122A).

The radio-frequency module (100; 100a; 100b; 100c; 100d; 100e) according to the sixth aspect enables the isolation between the receive filter (122A) and the transmit filter (112A) to be improved.

According to the radio-frequency module (100a; 100c; 100d; 100e) of a seventh aspect, in the fifth aspect, the electronic component (2) is a power amplifier (111).

The radio-frequency module (100a; 100c; 100d; 100e) according to the seventh aspect makes the heat, which is produced by the power amplifier (111), difficult to propagate to the transmit filter (112A), enabling the suppression of an increase of the temperature of the transmit filter (112A).

According to the radio-frequency module (100; 100a) of an eighth aspect, in the fifth aspect, the electronic component (2) is an IC chip (120) including a low-noise amplifier (121).

The radio-frequency module (100; 100a) according to the eighth aspect enables the isolation between the low-noise amplifier (121) and the transmit filter (112A) to be improved.

In the fourth aspect, the radio-frequency module (100b; 100c; 100d; 100e) according to a ninth aspect further includes an IC chip (120) including a low-noise amplifier (121). The IC chip (120) is mounted on the second principal surface (92) of the mount board (9). The acoustic wave filter (1) does not overlap the IC chip (120) in plan view in the thickness direction (D1) of the mount board (9).

The radio-frequency module (100b; 100c; 100d; 100e) according to the ninth aspect enables the isolation between the low-noise amplifier (121) and the transmit filter (112A) to be improved.

A communication device (300) according to a tenth aspect includes the radio-frequency module (100; 100*a*; 100*b*; 100*c*; 100*d*; 100*e*) according to any one of the first to ninth aspects, and a signal processing circuit (301). The signal processing circuit (301) is connected to the radio-frequency module (100; 100*a*; 100*b*; 100*c*; 100*d*; 100*e*).

The communication device (300) according to the tenth aspect enables the improved shielding to be achieved.

1 acoustic wave filter
12 principal surface
13 periphery
2 electronic component
3 metal block
31 surface
33 periphery
4 metal member
43 periphery
5 resin layer (first resin layer)
51 principal surface
53 periphery
6 shield layer
7 resin layer
71 principal surface
73 periphery
9 mount board
91 first principal surface
92 second principal surface
93 periphery
80 external connection terminal
81 antenna terminal
82 signal input terminal
83 signal output terminal
84 control terminal
85 ground terminal
100, 100*a*, 100*b*, 100*c*, 100*d*, 100*e* radio-frequency module
104 first switch
140 common terminal
141, 142 selection terminal
105 second switch
150 common terminal
151, 152 selection terminal
106 third switch
160 common terminal
161, 162 selection terminal
111 power amplifier
112A, 112B transmit filter
113 output matching circuit
115 controller
120 IC chip
121 low-noise amplifier
122A, 122B receive filter
123 input matching circuit
300 communication device
301 signal processing circuit
302 RF signal processing circuit
303 baseband signal processing circuit
310 antenna
L1, L2 inductor
L3 inductor

The invention claimed is:

1. A radio-frequency module comprising:
a mount board having a first principal surface, a second principal surface and a ground layer, the first principal surface and the second principal surface being opposite to each other;

an acoustic wave filter mounted on the first principal surface of the mount board;
a metal block disposed on the first principal surface of the mount board, and connected to the ground layer;
a resin layer disposed on the first principal surface of the mount board, and covering a periphery of the acoustic wave filter and a periphery of the metal block;
a shield layer covering a principal surface of the acoustic wave filter, the resin layer, and the metal block, the principal surface of the acoustic wave filter being opposite to a surface of the acoustic wave filter mounted to the mount board, and
a plurality of external connection terminals disposed on the second principal surface of the mount board,
wherein the metal block is in contact with the shield layer, and
wherein the plurality of external connection terminals include a ground terminal connected to the ground layer.

2. The radio-frequency module according to claim 1, wherein the acoustic wave filter is a transmit filter.

3. The radio-frequency module according to claim 2, further comprising:
an electronic component mounted on the first principal surface of the mount board, the electronic component and the acoustic wave filter being mounted on opposite sides of the metal block.

4. The radio-frequency module according to claim 3, wherein the electronic component is a receive filter.

5. The radio-frequency module according to claim 3, wherein the electronic component is a power amplifier.

6. The radio-frequency module according to claim 3, wherein the electronic component is an integrated circuit (IC) chip including a low-noise amplifier.

7. The radio-frequency module according to claim 2, further comprising:
an IC chip including a low-noise amplifier, and mounted on the second principal surface of the mount board,
wherein the acoustic wave filter does not overlap the IC chip in plan view in a thickness direction of the mount board.

8. A communication device comprising:
the radio-frequency module according to claim 1; and
a signal processing circuit connected to the radio-frequency module.

9. A communication device comprising:
the radio-frequency module according to claim 2; and
a signal processing circuit connected to the radio-frequency module.

10. A communication device comprising:
the radio-frequency module according to claim 3; and
a signal processing circuit connected to the radio-frequency module.

11. A communication device comprising:
the radio-frequency module according to claim 4; and
a signal processing circuit connected to the radio-frequency module.

12. A communication device comprising:
the radio-frequency module according to claim 5; and
a signal processing circuit connected to the radio-frequency module.

13. A communication device comprising:
the radio-frequency module according to claim 6; and
a signal processing circuit connected to the radio-frequency module.

14. A radio-frequency module comprising:

a mount board having a first principal surface, a second principal surface and a ground layer, the first principal surface and the second principal surface being opposite to each other;

an acoustic wave filter mounted on the first principal surface of the mount board;

a metal member disposed on a principal surface of the acoustic wave filter, the principal surface of the acoustic wave filter being opposite to a surface of the acoustic wave filter mounted on the mount board;

a metal block disposed on the first principal surface of the mount board, and connected to the ground layer;

a resin layer disposed on the first principal surface of the mount board, and covering a periphery of the acoustic wave filter, a periphery of the metal member, and a periphery of the metal block; and a shield layer covering the resin layer, the metal member, and the metal block, wherein the metal block is in contact with the shield layer.

15. The radio-frequency module according to claim 14, further comprising:

a plurality of external connection terminals disposed on the second principal surface of the mount board, wherein the plurality of external connection terminals include a ground terminal connected to the ground layer.

16. The radio-frequency module according to claim 14, wherein the acoustic wave filter is a transmit filter.

17. A communication device comprising:

the radio-frequency module according to claim 14; and a signal processing circuit connected to the radio-frequency module.

\* \* \* \* \*